(12) United States Patent
Kim et al.

(10) Patent No.: US 9,171,589 B2
(45) Date of Patent: Oct. 27, 2015

(54) MEMORY DEVICE, METHOD OF PERFORMING READ OR WRITE OPERATION AND MEMORY SYSTEM INCLUDING THE SAME

(71) Applicants: Chan-Kyung Kim, Hwaseong-si (KR); Yun-Sang Lee, Yongin-si (KR); Chul-Woo Park, Yongin-si (KR); Hong-Sun Hwang, Suwon-si (KR)

(72) Inventors: Chan-Kyung Kim, Hwaseong-si (KR); Yun-Sang Lee, Yongin-si (KR); Chul-Woo Park, Yongin-si (KR); Hong-Sun Hwang, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 430 days.

(21) Appl. No.: 13/705,143

(22) Filed: Dec. 4, 2012

(65) Prior Publication Data

US 2013/0148429 A1 Jun. 13, 2013

Related U.S. Application Data

(60) Provisional application No. 61/569,320, filed on Dec. 12, 2011.

(30) Foreign Application Priority Data

Oct. 24, 2012 (KR) .................. 10-2012-0118306

(51) Int. Cl.
*G11C 16/04* (2006.01)
*G11C 7/06* (2006.01)
*G11C 13/00* (2006.01)
(Continued)

(52) U.S. Cl.
CPC *G11C 7/06* (2013.01); *G11C 11/16* (2013.01); *G11C 13/0002* (2013.01); *G11C 13/0004* (2013.01); *G11C 16/26* (2013.01)

(58) Field of Classification Search
CPC ............ G11C 7/06; G11C 7/22; G11C 7/065; G11C 7/1051; G11C 11/16; G11C 11/15; G11C 11/419
USPC .......... 365/205, 189.05, 189.09, 189.14, 163, 365/171, 230.03, 230.08
See application file for complete search history.

(56) References Cited

U.S. PATENT DOCUMENTS 4,586,168 A * 4/1986 Adlhoch et al. ............... 365/156
5,646,885 A * 7/1997 Matsuo et al. ........... 365/185.05
(Continued)

OTHER PUBLICATIONS

Son, Jong-Pil, et al., "A Highly Reliable Multi-cell Antifuse Scheme Using DRAM Cell Capacitors," IEEE, pp. 482-485, 2010.
(Continued)

*Primary Examiner* — Gene Auduong
(74) *Attorney, Agent, or Firm* — Onello & Mello, LLP

(57) ABSTRACT

Provided is a memory device having a first switch configured to receive a first CSL signal to input or output data. A second switch is configured to receive a second CSL signal. A sensing and latch circuit (SLC) is coupled between the first and second switches. And at least one memory cell is coupled to the second switch. The second switch is configured to control timing of read or write operations of the at least one memory cell in response to the second CSL signal, e.g., where a read operation can be performed in not more than about 5 ns. The SLC operates as a latch in a write mode and as an amplifier in a read mode. The memory device may comprise part of a memory system or other apparatus including such memory device or system. Methods of performing read and write operations using such memory device are also provided.

51 Claims, 29 Drawing Sheets

(51) Int. Cl.
*G11C 11/16* (2006.01)
*G11C 16/26* (2006.01)

(56) References Cited

U.S. PATENT DOCUMENTS

| | | | |
|---|---|---|---|
| 5,757,696 A * | 5/1998 | Matsuo et al. | 365/185.07 |
| 6,185,143 B1 | 2/2001 | Perner et al. | |
| 6,282,137 B1 * | 8/2001 | Lee et al. | 365/207 |
| 6,512,690 B1 | 1/2003 | Qi et al. | |
| 2003/0081453 A1 | 5/2003 | Hidaka | |
| 2009/0237988 A1 | 9/2009 | Kurose et al. | |
| 2011/0035644 A1 * | 2/2011 | Madan | 714/758 |
| 2011/0157971 A1 | 6/2011 | Kim et al. | |
| 2011/0317497 A1 * | 12/2011 | Yoon et al. | 365/189.05 |

OTHER PUBLICATIONS

Tsuchida, Kenji, et al., "A 64Mb MRAM with Clamped-Reference and Adequate-Reference Schemes," ISSCC 2010, Session 14, Non-Volatile Memory, 14.2, pp. 258-260.

* cited by examiner

MEMORY DEVICE, METHOD OF PERFORMING READ OR WRITE OPERATION AND MEMORY SYSTEM INCLUDING THE SAME

CROSS-REFERENCE TO RELATED APPLICATION

This U.S. non-provisional application claims priority under 35 USC §119 to U.S. Provisional Application No. 61/569,320 filed on Dec. 12, 2011 in the USPTO, and Korean Patent Application No. 10-2012-0118306, filed on Oct. 24, 2012 in the Korean Intellectual Property Office (KIPO), the contents of which are herein incorporated by reference in their entirety.

FIELD OF INVENTION

The inventive concepts herein relate generally to semiconductor memory devices, and more particularly to a memory device, such as magnetic memory cells, a method of writing and/or reading data in the memory device, and a memory system including the memory device.

BACKGROUND

Non-volatile memory is a type of memory where the data written in the memory cells are retained—even after power to the memory cells is removed or off. Magneto-resistive random access memory (MRAM) is a type of such non-volatile memory. The MRAM is also a resistive memory such that the value of data stored in the memory cell is determined depending on the resistance of the memory cell. Particularly among the various resistive memories, the write operation and the read operation of the MRAM cell may be performed based on a current direction and a current amount.

Dynamic random access memory (DRAM) is widely used in computing systems and mobile devices and demands on performance of operational speed of the DRAM are increased, according to developments of hardware and software.

To substitute the widely used DRAM, the MRAM requires increase in the speed of the write operation and the read operation comparable to those of the DRAM.

SUMMARY

In accordance with an aspect of the present invention, provided is a memory device that comprises a first switch configured to receive a first CSL signal to input or output data, a second switch configured to receive a second CSL signal, a sensing and latch circuit coupled between the first and second switches, and at least one memory cell coupled to the second switch. The second switch is configured to control timing of read or write operations of the at least one memory cell in response to the second CSL signal.

In various embodiments, the second CSL may be a write CSL (WCSL) and the second switch may be a write switch.

In various embodiments, in a write operation, the sensing and latch circuit may be configured to latch.

In various embodiments, in a write operation, the device operates in a voltage mode.

In various embodiments, the second CSL may be a read CSL (RCSL) and the second switch may be a read switch.

In various embodiments, in a read operation, the sensing and latch circuit may be configured to operate as a sense amplifier.

In various embodiments, in a read operation, the device operates in a current mode.

In various embodiments, the second switch may be configured to transmit input and output data from and to the memory cell, respectively.

In various embodiments, the memory device may be a dynamic random access memory (DRAM), phase change random access memory (PRAM), resistive random access memory (RRAM), or a NAND flash memory.

In various embodiments, the memory device may be a magneto-resistive random access memory (MRAM).

In various embodiments, the MRAM may be a STT-MRAM.

In various embodiments, the memory cell may comprise a magnetic tunnel junction (MTJ) element coupled between a bit line and a cell transistor, the cell transistor having a gate coupled to a word line.

In various embodiments, the MTJ element may comprise a pinned layer, a non-magnetic barrier layer on the pinned layer, and a free layer on the barrier layer.

In various embodiments, the MTJ element may have a horizontally magnetized direction.

In various embodiments, the MTJ element may have a vertically magnetized direction.

In various embodiments, the memory cell may comprise a cell transistor and a dual magnetic tunnel junction (MTJ) element. The dual MTJ element may be connected to a bit line and the cell transistor, and the cell transistor may also be connected to a source line and a word line.

In accordance with another aspect of the present invention, provided is a memory device that comprises a first switch configured to receive a first CSL signal and to input/output data, a write switch configured to receive a write CSL (WCSL) signal, a sensing and latch circuit coupled between the first and write switches, and at least one memory cell coupled to the write switch. In a write operation, the sensing and latch circuit is configured to latch and transfer an input data to the memory cell in response to the write CSL signal.

In various embodiments, in a write operation, the device operates in a voltage mode.

In various embodiments, the second switch comprises at least one write column selection line (WCSL) generator configured to generate the WCSL signal from the first CSL signal and a delay circuit configured to also receive the first CSL signal and to output a delayed first CSL signal to disable the WCSL generator.

In various embodiments, the first and write switches may be activated simultaneously in the write operation.

In various embodiments, an activated duration of the first switch may be shorter than an activated duration of the write switch.

In various embodiments, the memory device may be a dynamic random access memory (DRAM), phase change random access memory (PRAM), resistive random access memory (RRAM), or a NAND flash memory.

In various embodiments, the memory device may be a magneto-resistive random access memory (MRAM).

In various embodiments, the MRAM may be a STT-MRAM.

In various embodiments, a latch circuit of the sensing and latch circuit may comprise a pair of inverters.

In various embodiments, the memory cell may comprise a magnetic tunnel junction (MTJ) element and a cell transistor.

In various embodiments, the memory cell may comprise a magnetic tunnel junction (MTJ) element coupled between a bit line and a cell transistor, the cell transistor having a gate coupled to a word line.

In accordance with another aspect of the present invention, provided is a memory device that comprises a first switch configured to receive a first CSL signal and to output data, a read switch configured to receive a read CSL (RCSL) signal, a sensing and latch circuit coupled between the first and read switches, a reference generation circuit configured to provide a complementary bit line signal to the sensing and latch circuit, and at least one memory cell coupled to the read switch. In a read operation, the sensing and latch circuit is configured as a sense amplifier.

In various embodiments, in a read operation, the device operates in a current mode.

In various embodiments, the memory device may further comprise a current mirror circuit coupled between the sensing and latch circuit and the read switch.

In various embodiments, the current mirror circuit may comprise a first transistor having a first size and a second transistor having a second size that is N times the first size, wherein N is an even number. The gates of the first and second transistors may be commonly connected and the second transistor may be configured to multiply the current of the first transistor by N.

In various embodiments, the device may further comprise a word line (WL) enable circuit coupled to the reference generation circuit and the memory cell. The WL enable circuit may be configured to provide a WL enable signal to the reference generation circuit in response to an active information signal. And the reference generation circuit may be configured to provide the RSCL signal to the RCSL switch in response the WL enable signal.

In various embodiments, the device may be configured to generate a pre-charge signal and the CSL signal subsequent to the RCSL signal to perform the read operation in not more than about 5 nanoseconds.

In various embodiments, the sensing and latching circuit may comprise a cross-coupled sense amplifier including a first PMOS transistor connected between a voltage source and a first NMOS transistor and a second PMOS transistor connected between the voltage source and a second NMOS transistor.

In various embodiments, the reference generation circuit may comprise a first reference memory cell configured to store a first value and a first reference switch coupled between the first memory cell and a complementary bit line BL_bar and a second reference memory cell configured to store a second value and a second reference switch coupled between the second memory cell and the complementary bit line BL_bar. The first and second reference switches may receive RCSL as an input.

In various embodiments, the first value may be a "0" and the second value may be a "1" and the reference generation circuit may be configured to output an average of the current from the first and second memory cells in response to RCSL.

In various embodiments, the reference generation circuit may comprise a first reference mirror circuit coupled between the first reference switch and the complementary bit line BL_bar and a second reference mirror circuit coupled between the second reference switch and the complementary bit line BL_bar.

In various embodiments, the memory device may comprise a dynamic random access memory (DRAM), phase change random access memory (PRAM), resistive random access memory (RRAM), or a NAND flash memory.

In various embodiments, the memory device may be a magneto-resistive random access memory (MRAM).

In various embodiments, the MRAM may be a STT-MRAM.

In accordance with aspects of the present invention, provide is a sensing and latching circuit (SLC) of a memory device comprising a sensing and latch element, which is configured to couple to a write bit line (BLwrite) in a write operation, couple to a read bit line (BLread), separate from BLwrite, and to a complementary read bit line (BLread_bar) during a read operation.

In various embodiments, the sensing and latch element may be responsive to an evaluation signal (EVAL) to compare the currents from BLread and BLread_bar.

In various embodiments, the SLC may further comprise a pre-charge circuit and an equalizer circuit, each coupled to the sensing and latch element. The pre-charge circuit, equalizer circuit, and sensing and latch element may be configured to pre-charge BLwrite, BLread and BLread_bar.

In various embodiments, the pre-charge circuit may comprise first and second PMOS transistors, and the equalizer circuit may comprise a third PMOS transistor. The first, second, and third transistors may have commonly connected gates.

In various embodiments, the sensing and latching circuit may comprise a cross-coupled sense amplifier including a first PMOS transistor connected between a voltage source and a first NMOS transistor and a second PMOS transistor connected between the voltage source and a second NMOS transistor.

In various embodiments, the complementary read bit line BLread_bar may be coupled to a reference generation circuit.

In various embodiments, the reference generation circuit may comprise a first reference memory cell storing a first value and a first reference switch coupled between the first memory cell and the complementary read bit line BLread_bar and a second reference memory cell storing a second value and a second reference switch coupled between the second memory cell and the complementary read bit line BLread_bar. The first and second values may be different values.

In various embodiments, the memory device may be a dynamic random access memory (DRAM), phase change random access memory (PRAM), resistive random access memory (RRAM), or a NAND flash memory.

In various embodiments, the memory device may be a magneto-resistive random access memory (MRAM).

In various embodiments, the MRAM may be a STT-MRAM.

In accordance with another aspect of the present invention, provided is a memory device that comprises a first sub-array including a first reference cell L line and a first reference cell H line running in a first direction and substantially centered within the first sub-array and a first word line (WL) through the first sub-array running in a second direction, a first plurality of SLCs, each of the first plurality SLCs having a RefL input and a RefH input, a first reference voltage bias line L commonly connected to the RefL inputs of each SLC in the first plurality of SLCs and to the first reference cell L line, and a first reference voltage bias line H commonly connected to the RefH inputs of each SLC in the first plurality of SLCs and to the first reference cell L line.

In various embodiments, the memory device may further comprise a second sub-array coupled to the first sub-array and including a second reference cell L line and a second reference cell H line running in the first direction and substantially centered within the second sub-array and a second WL through the second sub-array running in the second direction, a second plurality of SLCs, each of the second plurality SLCs having a RefL input and a RefH input, a second reference voltage bias line L commonly connected to the RefL inputs of each SLC in the second plurality of SLCs and to the second reference cell L line, and a second reference voltage bias line H commonly connected to the RefH inputs of each SLC in the second plurality of SLCs and to the second reference cell L line.

In various embodiments, the first word line WL and the second word line WL of the first and second sub-arrays, respectively, are each normal word lines and the first and second sub-arrays each further comprise at least one reference word line disposed in the second direction on one side of the nominal word line WL. Simultaneous activation of a normal word line from one of the first or second sub-arrays and a reference word line from the other of the first and second sub-arrays causes a reference current to be generated from the other of the first and second sub-arrays.

In various embodiments, each of the first and second sub-arrays may further comprise a second reference word line disposed in the second direction on an opposite side of the nominal word line WL. The second reference word line in the other of the first and second sub-array may also be simultaneously activated.

In various embodiments, the memory device may be a dynamic random access memory (DRAM), phase change random access memory (PRAM), resistive random access memory (RRAM), or a NAND flash memory.

In various embodiments, the memory device may be a magneto-resistive random access memory (MRAM).

In various embodiments, the MRAM may be a STT-MRAM.

In various embodiments, the device may further comprise a common reference generation circuit configured to generate a low reference current (RefL current) and a high reference current (RefH current), at least one first half-mirror circuit coupled to at least one SLC and configured to receive the RefL current at the RefL input of the at least one SLC, and at least one second half-mirror circuit coupled to the at least one SLC and configured to receive the RefH current at the RefH input of the at least one SLC.

In various embodiments, at least one SLC may be connected to at least 4 bit lines.

In various embodiments, at least one SLC may be connected to at least 8 bit lines.

In various embodiments, the at least 8 bit lines may run in the first direction.

In various embodiments, the device may comprise a plurality of sub-arrays, including the first sub-array, and a sub-array from the plurality of sub-arrays may be selected with at least one column selection signal.

In various embodiments, the device may further comprise a control circuit including at least one sense and latch element, which is configured to select a bit line within the selected sub-array.

In various embodiments, the control circuit may further comprise a plurality of selection circuits, with one selection circuit for each sub-array, wherein each selection circuit may be configured to select a bit line within its corresponding sub-array under the control of the sense and latch element.

In accordance with another aspect of the present invention, provided is a method of performing a write operation to a memory device. The method comprises turning on a first switch for inputting input data, turning on a write switch simultaneously with the first switch, storing the input data by a sensing and latch circuit coupled between the first and write switches, selecting a memory cell coupled to the write switch, and writing the input data to the memory cell.

In various embodiments, at least one of the first and write switches may be an NMOS switch.

In various embodiments, both of the first and write switches may be NMOS switches.

In various embodiments, the method may further include operating the sensing and latch circuit in a voltage mode.

In various embodiments, the memory device may be a dynamic random access memory (DRAM), phase change random access memory (PRAM), resistive random access memory (RRAM), or a NAND flash memory.

In various embodiments, the memory device may be a magneto-resistive random access memory (MRAM).

In various embodiments, the MRAM may be a STT-MRAM.

In accordance with another aspect of the invention, provided is a method of performing a read operation to a memory device. The method comprises selecting a memory cell with a word line signal, turning on a read switch coupled to the memory cell to select data, transmitting the data to a bit line from the memory cell and simultaneously supplying a reference current to a complementary bit line of the bit line from a reference current generation circuit, in a sensing and latch circuit, sensing the data by comparing a bit line current and the reference current, and turning on a first switch coupled to the sensing and latch circuit to transmit the sensed data to an output circuit.

In various embodiments, at least one of the first and read switches may be an NMOS switch.

In various embodiments, the method may further include operating the sensing and latch circuit in a current mode.

In various embodiments, the memory device may be a dynamic random access memory (DRAM), phase change random access memory (PRAM), resistive random access memory (RRAM), or a NAND flash memory.

In various embodiments, the memory device may be a magneto-resistive random access memory (MRAM).

In various embodiments, the MRAM may be a STT-MRAM.

In accordance with another aspect of the present invention, provided is a memory system. The memory system comprises a memory controller, at least one memory device, and at least one communication link coupled between the controller and the memory device. The at least one memory devices comprises a first switch configured to receive a first CSL signal and to input or output data, a second switch configured to receive a second CSL signal, a sensing and latch circuit coupled between the first and second switches, and at least one memory cell coupled to the second switch. The second switch is configured to control timing of read or write operations of the at least one memory cell in response to the second CSL signal.

In various embodiments, the controller may include a control unit coupled to an electrical-to-optical (E/O) transmitting interface and an optical-to-electrical (O/E) receiving interface, and the at least one memory device may include a memory core coupled to an electrical-to-optical (E/O) transmitting interface and an optical-to-electrical (O/E) receiving interface. And the at least one communication link may include a first optical link coupled between the controller E/O interface and the memory device O/E interface and a second optical link coupled between the controller O/E interface and the memory device E/O interface.

In various embodiments, the communication link may be a bidirectional link.

In various embodiments, the controller may include a control unit coupled to a multi-pin input/output (I/O) interface, the at least one memory device may include a memory core coupled to a multi-pin I/O interface, and the at least one communication link may include a memory controller interface coupling pins of the control unit multi-pin I/O interface to corresponding pins of the memory device multi-pin I/O interface.

In various embodiments, the memory controller interface may be configured to carry a command signal, a control signal, a memory address, a data strobe signal, and data between the controller and the at least one memory device.

In various embodiments, the memory controller interface may be configured to carry a chip selection and address packet, and data between the controller and the at least one memory device.

In various embodiments, the memory controller interface may be configured to carry a chip selection, address, and write data packet, and read data between the controller and the at least one memory device.

In various embodiments, the memory controller interface may be configured to carry a command, address, and data packet, and read data between the controller and the at least one memory device.

In various embodiments, the at least one memory device may comprise at least one memory chip and the memory controller interface may be part of an interface chip arranged in a stack with the at least one memory chip, wherein the at least one memory chip and interface chip are interconnected using micro-bumps and through silicon vias.

In various embodiments, the memory system may form part of a computer system that further comprises a user interface device, a CPU, and a bus connecting the CPU, user interface device, and the at least on memory device.

In various embodiments, the memory system may form part of a computer system that further comprises a user interface device, a CPU, a random access memory, a modem, and a bus connecting the CPU, user interface device, modem, and the memory controller.

In various embodiments, the memory device may be a dynamic random access memory (DRAM), phase change random access memory (PRAM), resistive random access memory (RRAM), or a NAND flash memory.

In various embodiments, the memory device may be a magneto-resistive random access memory (MRAM).

In various embodiments, the MRAM may be a STT-MRAM.

BRIEF DESCRIPTION OF THE DRAWINGS

Aspects of the inventive concept will be more clearly understood by those skilled in the art from the following detailed description taken in conjunction with the accompanying drawings, and the non-limiting embodiments of devices, systems, and methods provided and described therein or with respect thereto.

DETAILED DESCRIPTION OF THE EMBODIMENTS

Figure 1:
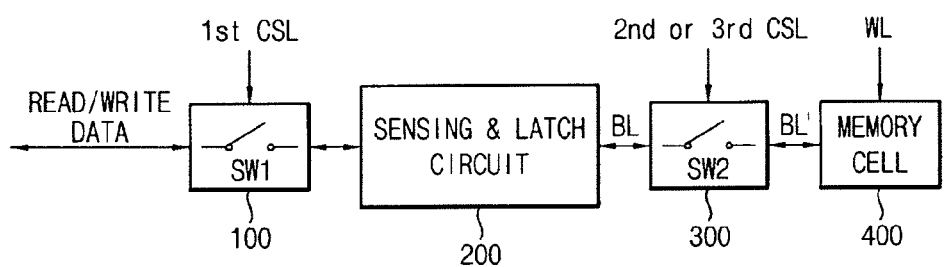
FIG. 1 is a block diagram of an example embodiment of a memory device useful for describing a write operation and a read operation therein, according to aspects of the inventive concept.

Various aspects of the inventive concept will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These Willis are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of an example embodiment of a memory device useful for describing a write operation and a read operation therein, according to aspects of the inventive concept.

Referring to the embodiment of FIG. 1, a first switch 100 is configured to communicate with another device, sub-system, or system for the reading and writing of data to memory cell 400, which may be referred to as an external device. A sensing and latch circuit 200 is disposed between the first switch 100 and the memory cell 400. And a second switch 300 is disposed between the sensing and latch circuit 200 and the memory cell 400. In the case of a write operation, the sensing and latch circuit 200 may function as a latch circuit. And in the case of a read operation the sensing and latch circuit 200 may function as a sense amplifier.

In the example embodiment, to write data into the memory cell 400, the first switch 100 is turned on in response to a first column select signal that is applied to the first switch 100 through a first column select line ($1^{st}$ CSL). When the first switch 100 is turned on, the data to be written into the memory cell 400 is temporarily stored in the sensing and latch circuit 200. The second switch 300 is turned on in response to a second column select signal that is applied to the second switch 300 through a second column select line ($2^{nd}$ CSL). When the second switch 300 is turned on, the data are transferred from a first bit line BL to a second bit line BL' and the data are written in the memory cell 400 that is selected by a word line WL.

In the example embodiment, to read data from the memory cell 400, the second switch 300 is turned on in response to a third column select signal that is applied to the second switch 300 through a third column select line ($3^{rd}$ CSL), and then the data are transferred from the second bit line BL' to the first bit line BL, via the sensing and latch circuit 200. The data are amplified by the sensing and latch circuit 200. When the first switch 100 is turned on in response to the first column select signal that is applied to the first switch 100 through the first column select line, the amplified data are transferred to the external device.

Even though the memory device illustrated in FIG. 1 has the data path common to the write operation and the read operation, the read data path and the write data path may be separated and divided as described below.

Figure 2:
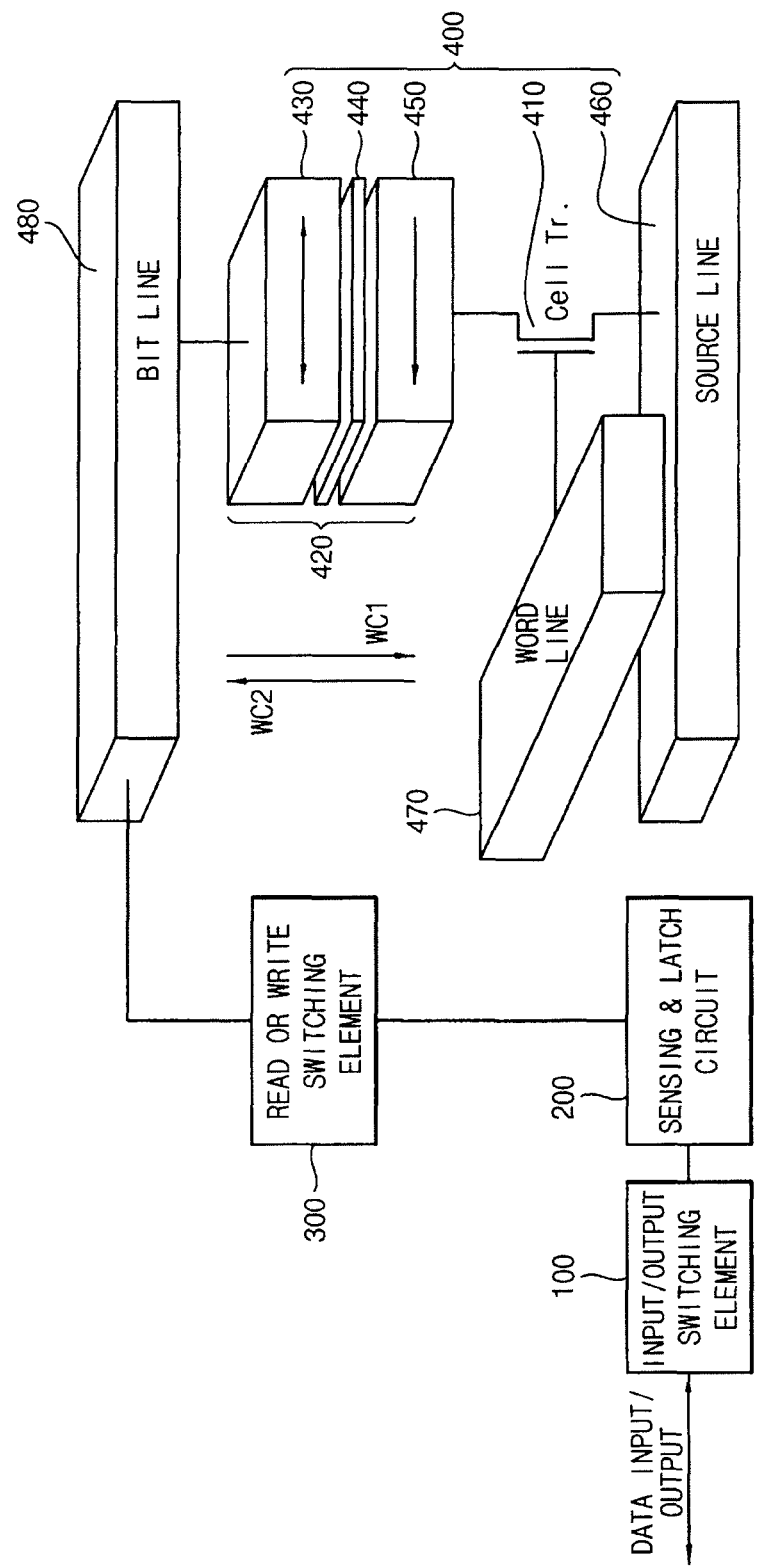
FIG. 2 is a block diagram illustrating an example embodiment of a connection between a spin transfer torque (STT)-MRAM cell and other memory device elements, according to aspects of the inventive concept.

FIG. 2 is a block diagram illustrating an example embodiment of a connection between a spin transfer torque (STT)-

MRAM cell and other memory device elements, according to aspects of the inventive concept.

Referring to FIG. 2, a STT-MRAM cell 400 includes a cell transistor 410 and a magnetic tunnel junction (MTJ) element 420. The MTJ element 420 and the cell transistor 410 are coupled between a bit line 480 and a source line 460, and a gate of the cell transistor 410 is coupled to a word line 470. A read or write switching element is coupled between the bit line 480 and the sensing and latch circuit 200. As in FIG. 1, the sensing and latch circuit 200 is coupled to a $1^{st}$ switch 100, sometimes referred as an input/output switching element 100.

In the read operation, the cell transistor 410 is selected by the word line signal and then the data value stored in the MTJ element 420 is transferred to the bit line 480. Through a read or write switching element 300, the read data value is transferred to the sensing and latch circuit 200 and amplified thereby, as discussed above. When the input/output switching element 100 is turned on, the data value is transferred to an external device.

In the write operation, the data value provided from an external device is latched in the sensing and latch circuit 200 and the latched data value is transferred to the bit line 480 when the read or write switching element 300 is turned on. The data value is written or programmed into the MTJ element 420 as a function of the voltage difference between the bit line 480 and the source line 460 if the cell transistor 410 is selected and turned on by the word line signal.

In this embodiment, the MTJ element 420 may include a pinned layer 450, a barrier layer 440 and a free layer 430. The magnetizing direction of the free layer 430 may be changed depending on a current flowing through the MTJ element 420. For example, if a first write current WC1 is applied in a first direction, free electrons having the spin direction equal to the pinned layer 450 apply a torque to the free layer 430. In this case, the free layer 430 is magnetized in parallel with the pinned layer 450. If a second write current WC2 is applied in a second, opposite direction, free electrons having the spin direction opposite to the pinned layer 450 apply a torque to the free layer 430. In this case, the free layer 430 is magnetized in anti-parallel with the pinned layer 450. The MTJ element 420 of the parallel magnetization has a relatively lower resistance and thus stores the data value of "0". The MTJ element 420 of the anti-parallel magnetization has a relatively higher resistance and thus stores the data value of "1".

FIGS. 3A through 3E are block diagrams illustrating examples of an MTJ element in an STT-MRAM cell, according to aspects of the inventive concept. For example, STT-MRAM cell 400 could take the form of the STT-MRAM cell embodiments of FIGS. 3A through 3E.

Figure 3A:
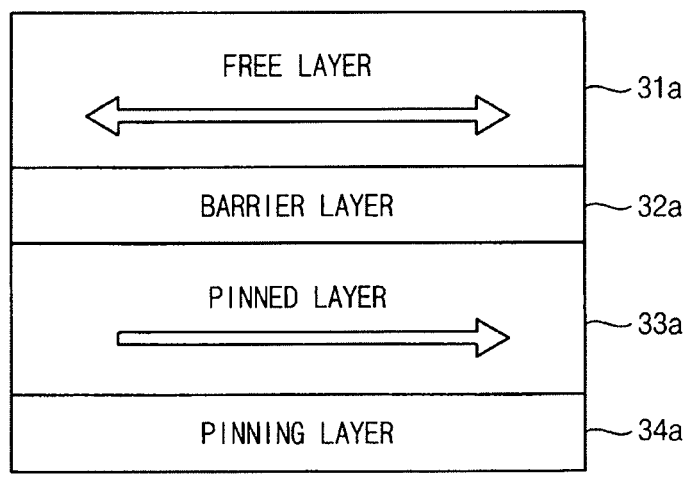
FIGS. 3A through 3E are block diagrams illustrating examples of a magnetic tunnel junction (MTJ) element in an STT-MRAM cell, according to aspects of the inventive concept.

Referring FIG. 3A, an embodiment of an MTJ layer having a horizontal structure is shown. In this embodiment, an MTJ element 421 may include a free layer 31a, a barrier layer 32a, a pinned layer 33a, and a pinning layer 34a, which are shown here in a stacked arrangement. In some embodiments, the pinning layer 34a may be optional.

The free layer 31a may include material having variable magnetizing direction, as indicated by the double arrow shown therein. The magnetizing direction of the free layer 31a may be changed depending on electric and/or magnetic factors provided internally or externally. The free layer 31a may include or be formed of ferromagnetic material. For example, the free layer 31a may include at least one of FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12.

The barrier layer 32a may have a thickness smaller than a spin diffusion distance. The barrier layer 32a may include or be formed of non-magnetic material. For example, the barrier layer 32a may include at least one of Mg, Ti, Al, MgZn, MgB-oxide, Ti, and V-nitride.

The pinned layer 33a may have a magnetizing direction that is fixed by the pinning layer 34a, as is indicated by the single arrow shown therein. The pinned layer 33a may include or be Ruined of ferromagnetic material. For example, the pinned layer 33a may include at least one of FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12.

The pinning layer 34a may include or be formed of anti-ferromagnetic material. For example, the pinning layer 34a may include at least one of PtMn, IrMn, MnO, MnS, MnTe, MnF2, FeCl2, FeO, CoCl2, CoO, NiCl2, NiO and Cr.

When the free layer 31a and the pinned layer 33a are formed with ferromagnetic materials, stray fields may be caused at the edges of the ferromagnetic materials. The stray fields may decrease magneto-resistance or increase resistive magnetic force in the free layer. The stray fields may affect the switching characteristic to cause asymmetric switching. Accordingly structures for reducing or controlling the stray fields are required.

Figure 3B:
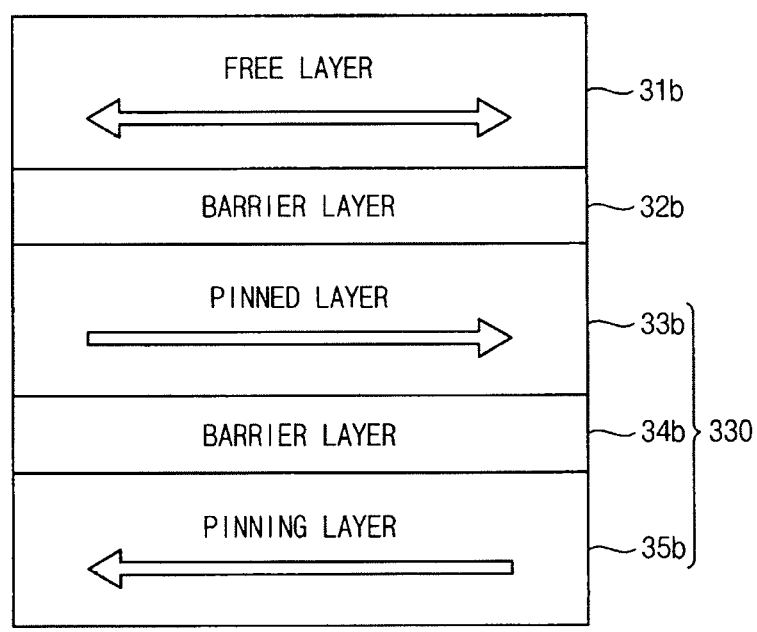

Referring to FIG. 3B, another embodiment of an MTJ layer having a horizontal structure is shown. In this embodiment, a pinned layer 330 of a MTJ element 422 may be implemented with a synthetic anti-ferromagnetic (SAF) structure. A free layer 31b and a barrier layer 32b may be disposed on the pinned layer 330.

The pinned layer 330 may include a pinned layer 33b, a barrier layer 34b, and a pinning layer 35b. The pinned layer 33b and the pinning layer 35b may include at least one of CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12, respectively. The magnetizing direction of the pinned layer 33b may be opposite to the magnetizing direction of the pinning layer 35b, and the magnetizing directions of the pinned layer 33b and the pinning layer 35b may be fixed. The barrier layer 34b may include Ru, as an example.

Figure 3C:
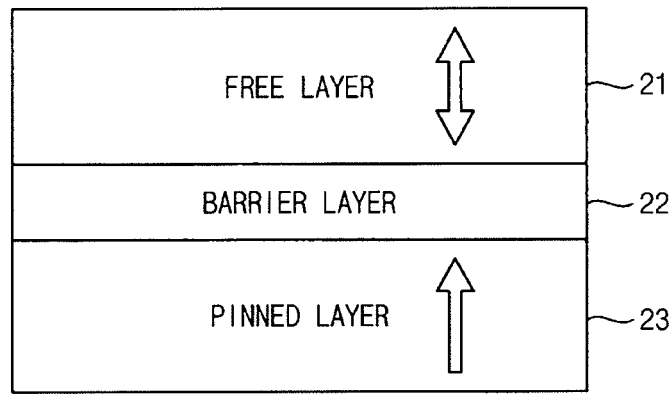

Referring to FIG. 3C, an MTJ layer with a vertical structure may be provided. The MTJ element 423 may include a free layer 21, a barrier layer 22 and a pinned layer 23, where the free layer 21 and the pinned layer 23 have a vertical magnetizing direction. The magnetization direction of the free layer may 21 be variable and the magnetization direction of the pinned layer 23 may be fixed.

The resistance of the MTJ element 423 may be decreased when the magnetizing directions of the free layer 21 and the pinned layer 23 are parallel with each other and the resistance of the MTJ element 423 may be increased when the magnetizing directions of the free layer 21 and the pinned layer 23 are anti-parallel (not parallel) with each other.

To implement the MTJ element 423, the free layer 21 and the pinned layer 23 may include materials having relatively large anisotropic energy. Amorphous rare-earth element alloys, multi-layer thin films such as (Co/Pt)n and (Fe/Pt)n, and super lattice of L10 crystalline structure may have relatively large anisotropic energy. For example, the free layer 21 may be ordered alloy and may include at least one of Fe, Co, Ni, Pa and Pt. The free layer 21 may include Fe—Pt alloy, Fe—Pd alloy, Co—Pd alloy, Co—Pt alloy, Fe—Ni—Pt alloy, Co—Fe—Pt alloy, and Co—Ni—Pt alloy. The alloys may be represented as Fe50Pt50, Fe50Pd50, Co50Pd50, Co50Pt50, Fe30Ni20Pt50, Co30Fe20Pt50, or Co30Ni20Pt50 in chemical quantity, as examples.

Figure 3D:
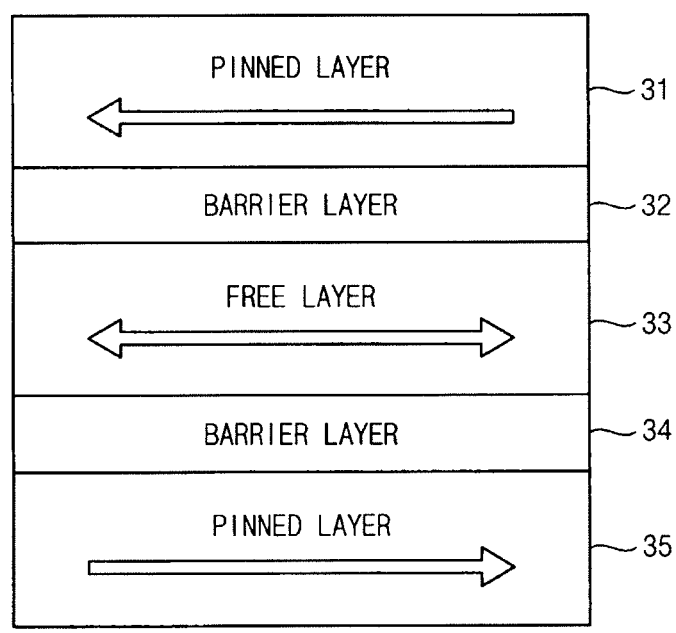
Figure 3E:
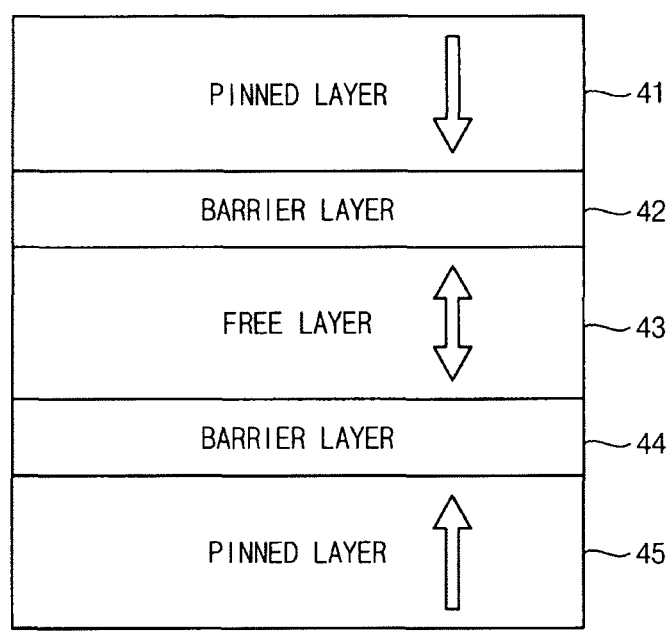

FIGS. 3D and 3E illustrate dual MTJ elements of the STT-MRAM cell. In the dual MTJ element, a free layer is disposed at a center portion and barrier layers and pinned layers are disposed symmetrically at both surfaces of the free layer.

Referring to FIG. 3D, a dual MTJ element 424 forming horizontal magnetization includes a first pinned layer 31, a first barrier layer 32, a free layer 33, a second barrier layer 34 and a second pinned layer 35. The materials forming the respective layers can be similar to or the same as the free layer 31a, the barrier layer 32a, and the pinned layer 33a of FIG. 3A.

If the magnetizing direction of the first pinned layer 31 is fixed to be opposite to the magnetizing direction of the second pinned layer 35, the magnetic fields due to the first and second pinned layers 31 and 35 may be countervailed and thus the dual MTJ element 424 may be programmed with a smaller write current than the general MTJ. In addition, the dual MTJ element 424 provides the greater resistance in the read operation due to the additional second barrier layer 34. Thus, the read margin may be increased and the exact read data may be obtained.

Referring to FIG. 3E, a dual MTJ element 425 forming vertical magnetization includes a first pinned layer 41, a first barrier layer 42, a free layer 43, a second barrier layer 44 and a second pinned layer 45. The materials forming the respective layers can be similar to or the same as the free layer 31a, the barrier layer 32a, and the pinned layer 33a of FIG. 3A.

If the magnetizing direction of the first pinned layer 41 is fixed to be opposite to the magnetizing direction of the second pinned layer 45, the magnetic fields due to the first and second pinned layers 41 and 45 may be countervailed and thus the dual MTJ element 425 may be programmed with the smaller write current than the general MTJ.

Figure 4:
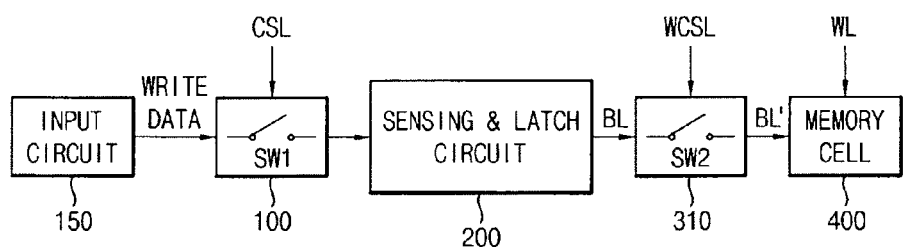
FIG. 4 is a block diagram of an example embodiment of a memory device useful for describing a write operation, according to aspects of the inventive concept.

FIG. 4 is a block diagram of an example embodiment of a memory device useful for describing a write operation, according to aspects of the inventive concept.

Referring to FIG. 4, write data may be transferred to the first switch (SW1) 100 through an input circuit 150. The first switch 100 may be turned on in response to the first column select signal CSL and then, as a result, the write data may be temporarily stored in the sensing and latch circuit 200. The second switch (SW2) 310 may then be turned on in response to the second column select signal WCSL and the write data stored in the sensing and latch circuit 200 may be transferred from the first bit line BL to the second bit line BL'. The data may finally be written into the memory cell 400 corresponding to the selected word line WL.

Figure 6:
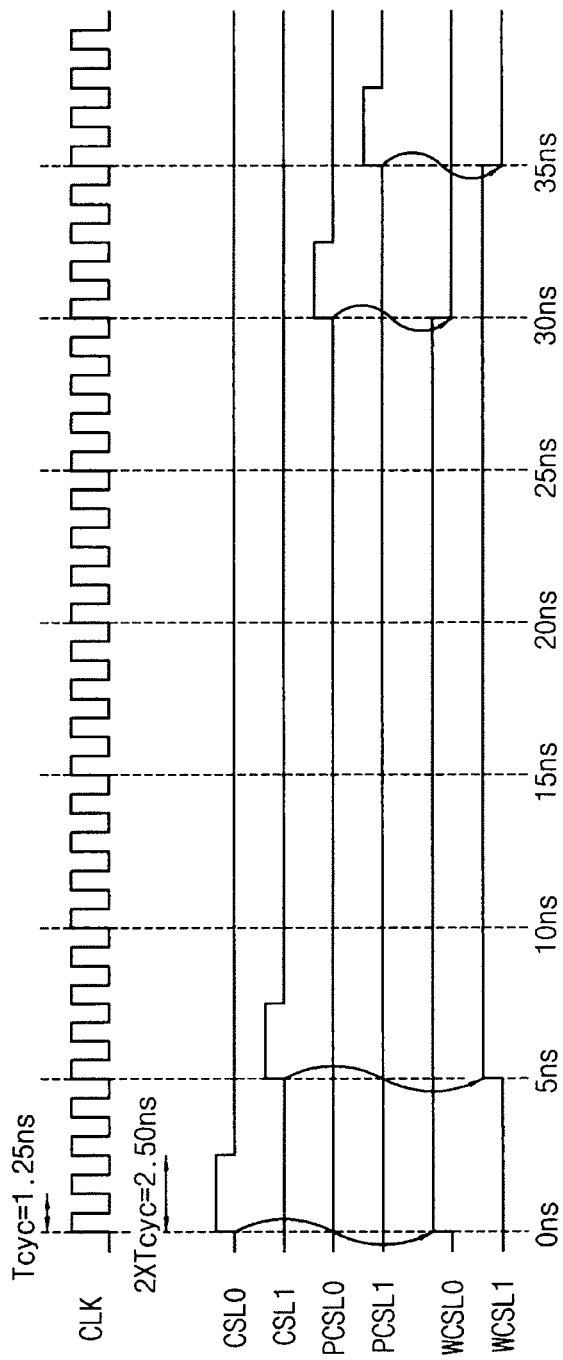
FIG. 6 is a timing diagram illustrating an example embodiment of a write operation of the memory device of FIGS. 4 and 5, according to aspects of the inventive concept.

In some example embodiments, in the write operation, the first switch 100 and the second switch 310 may be turned on simultaneously. The turn-on time of the second switch 310, that is, the activation time period of the second column select signal WCSL, may be longer than the turn-on time of the first switch 100, that is, the activation time period of the first column select signal CSL, as illustrated in FIG. 6. In other example embodiments, the first switch 100 and the second switch 310 may be turned on sequentially. For example, the first switch 100 may be turned on first and then the second switch 310 may be turned on.

The turn-on time of the second switch 310 may be determined considering the switching time of the MTJ element for write programming or write operation. For example, the turn-on time of the first switch 100 may be a few nanoseconds and the turn-on time of the second switch 310 may be tens of nanoseconds. In such a case, the column select cycle compatible with the DRAM interface of high speed may be secured externally and the switching time of the MTJ element for the write programming may be secured internally.

Therefore, according to the embodiment of FIG. 4, input data for writing is inputted, the first switch 100 is turned on by CSL, the sensing and latch circuit 200 stores the input data using a latch portion of the circuit, and the input data is then written into the memory cell 400 when WSCL turns on the second switch 300.

Figure 5:
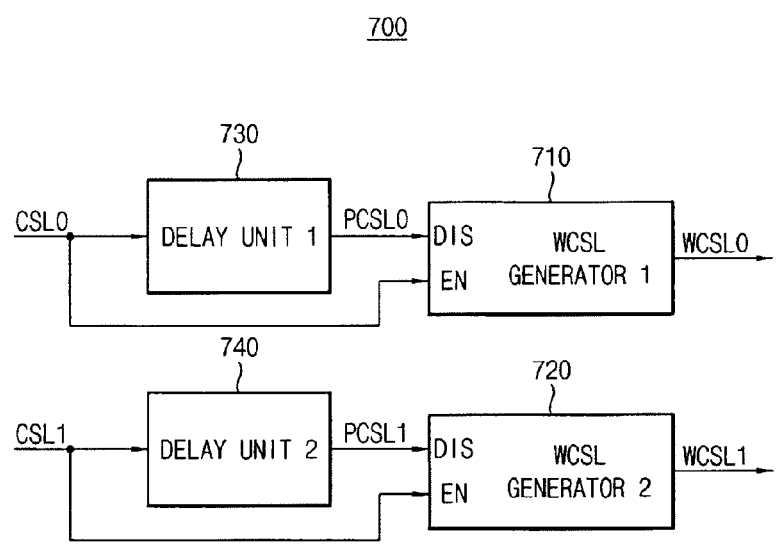
FIG. 5 is a block diagram illustrating an example embodiment of a write column select signal generator that can be used to generate a second column select signal in the memory device of FIG. 4, according to aspects of the inventive concept.

FIG. 5 is a block diagram illustrating an example embodiment of a write column select signal generator that can be used to generate a second column select signal in the memory device of FIG. 4, according to aspects of the inventive concept.

FIG. 5 illustrates, as a non-limiting example, a column select signal generator 700 including two WCSL generators 710 and 720 that are configured to receive two first column select signals CSL0 and CSL1 and to generate two second column select signals WCSL0 and WCSL1. The first column select signal CSL0 is input to the delay unit 730 to generate the delay signal PCSL0 for disabling the WCSL generator 710. Also, the first column select signal CSL0 is input directly to the WCSL generator 710 for enabling the WCSL generator 710. For example, the WCSL generator 710 may activate the second column select signal WCSL0 in response to the first column select signal CSL0 and deactivate the second column select signal WCSL0 in response to the delay signal PCSL0.

In the same way, the WCSL generator 720 may activate the second column select signal WCSL1 in response to the first column select signal CSL1 and deactivate the second column select signal WCSL1 in response to the delay signal PCSL1 from the delay unit 740.

FIG. 6 is a timing diagram illustrating an example embodiment of a write operation of the memory device of FIGS. 4 and 5, according to aspects of the inventive concept.

Referring to FIG. 6, one clock cycle (Tcyc) may be equal to 1.25 ns (nanoseconds) and, therefore, two clock cycles may be equal to 2.5 ns. The first switch (e.g., first switch 100) may be turned on in response to the first column select signal CSL0. The second switch (e.g., second switch 310) may be turned on simultaneously with the first switch, in response to the second column select signal WCSL0 (or write CSL0).

The first column select signal CSL0 may be activated for the two clock cycles, e.g., 2.5 ns. The second column select signal WCSL0 may be deactivated in response to the delay signal PCSL0 that is generated by the delay unit (e.g., delay unit 730) receiving the first column select signal CSL0. The activation time period of the second column select signal WCSL0 is longer than the activation time period of the first column select signal CSL0. For example, the second column select signal WCSL0 may be activated for 30 ns to secure sufficient programming time of an MTJ element. During the activation time period of the second column select signal WCSL0, WCSL0 is output by the WCSL generator (WCSL generator 710).

Another first column select signal CSL1 corresponding to the next column may be input four clock cycles after the first column select signal CSL0. And another corresponding second column select signal WCSL1 may be deactivated in response to the delay signal PCSL1 generated by a corresponding delay unit (e.g., delay unit 740). As above, the activation time period of the second column select signal WCSL1 is longer than the activation time period of the first column select signal CSL1. During the activation time period of the second column select signal WCSL1, WCSL1 is output by the WCSL generator (WCSL generator 720).

As will be understood by those skilled in the art, the foregoing can be repeated for additional memory cells.

Figure 7:
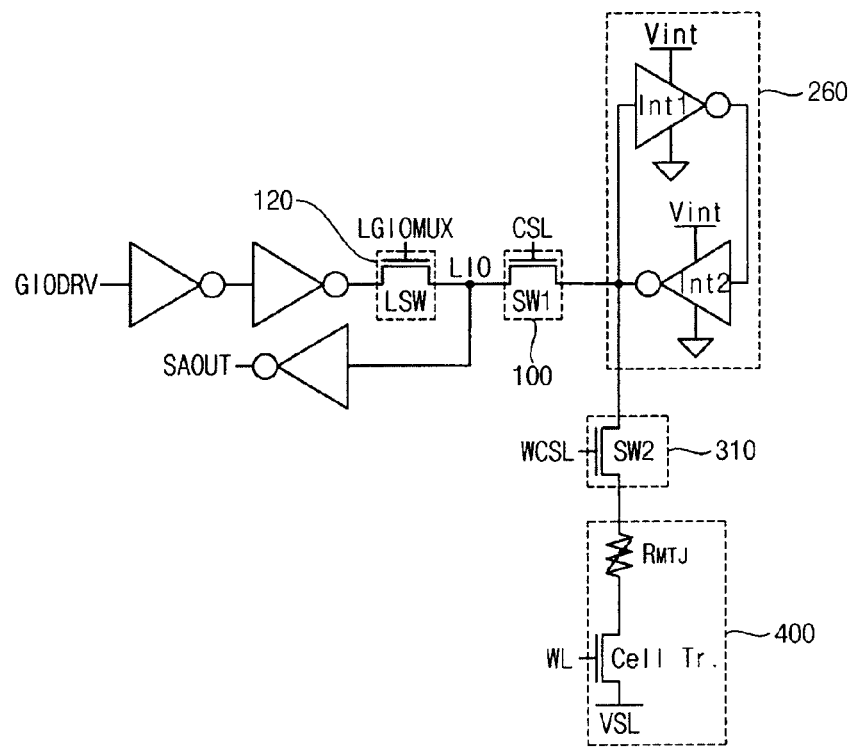
FIG. 7 is a circuit diagram illustrating an example embodiment of a memory device configured to perform a write operation, according to aspects of the inventive concept.

FIG. 7 is a circuit diagram illustrating an example embodiment of a memory device configured to perform a write operation, according to aspects of the inventive concept.

Referring to FIG. 7, the write data may be input through a global input-output driver (GIODRV) that is coupled to a local switch (LSW) 120. The LSW switch 120 may include an NMOS transistor that is turned on in response to a local mux signal (LGIOMUX). The LSW switch 120 may be coupled to the first switch 100 that is turned on in response to the first column select signal CSL. The first switch (SW1) 100 may be coupled to the sensing and latch circuit 260. The sensing and latch circuit 260 may include a first inverter Int1 and a second inverter Int2 that temporarily latch the data value provided through the first switch 100. The sensing and latch circuit 260 may be coupled to the second switch (SW2) 310. The second switch 310 may include an NMOS transistor that is turned on in response to the second column select signal WCSL. The second switch 310 may be directly coupled to the memory cell 400. The memory cell 400 may include the cell transistor (Cell Tr.) and the data storage unit of the MTJ element, shown as $R_{MTJ}$. The memory cell 400 may be selected based on the word line signal WL that is input to the gate of the cell transistor Cell Tr.

Figure 8:
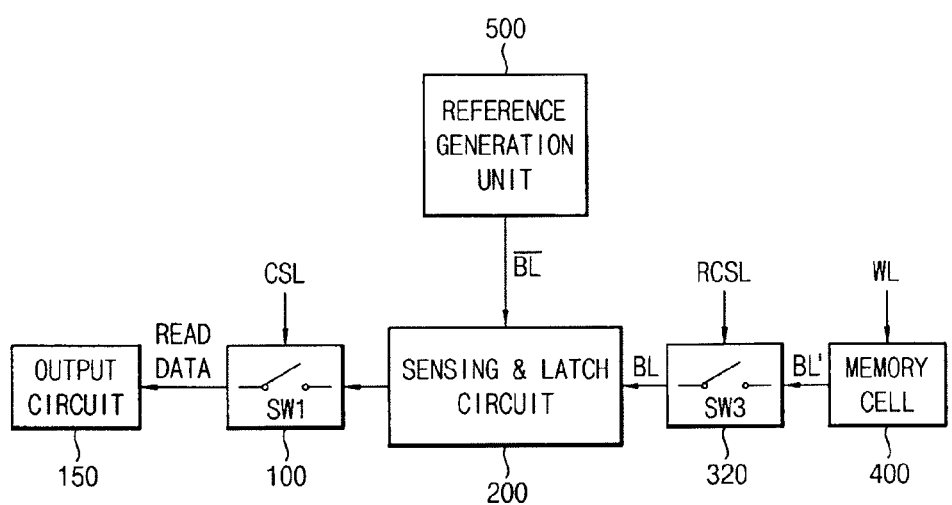
FIG. 8 is a block diagram illustrating an example embodiment of a memory device configured to perform a read operation, according to aspects of the inventive concept.

FIG. 8 is a block diagram illustrating an example embodiment of a memory device configured to perform a read operation, according to aspects of the inventive concept.

Referring to FIG. 8, data stored in the memory cell 400 may be transferred to the second bit line BL' when the memory cell 400 is selected by the word line signal WL and transferred to the first bit line BL when the third switch (SW3) 320 is turned on in response to the third column select signal RCSL. The sensing and latch circuit 200 amplifies the transferred data value by comparing the data current on the first bit line BL and a reference current on the complementary bit line BL_bar. The reference current may be generated by the reference generation circuit 500 and then applied to the complementary bit line BL_bar. The amplified data value is transferred from the sensing and latch circuit 200 to the output circuit 150 as the read data when the first switch (SW1) 100 is turned on in response to the first column select signal CSL. As a result, the read data may be provided to the external device, via output circuit 150.

Therefore, in accordance with the embodiment of FIG. 8, data from the memory cell 400 that is selected by the word line signal (WL) is transmitted to the sensing and latch circuit 200 when the third switch 320 is turned on by the RCSL signal. The sensing and latching circuit 200 amplifies the read data and outputs the data via the first switch 100 by turning on the CSL signal.

Figure 9:
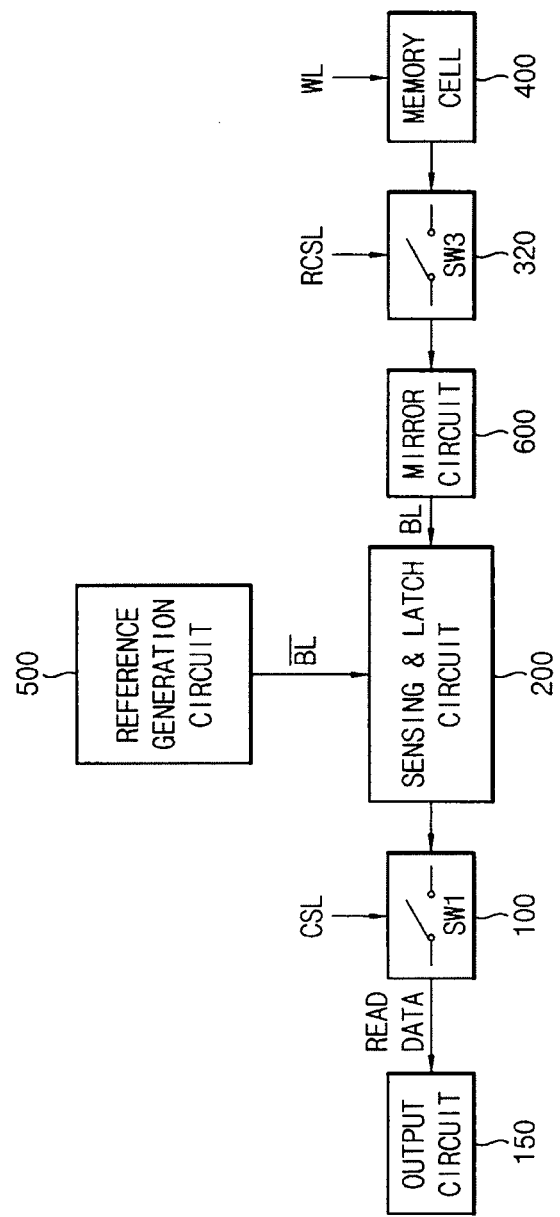
FIG. 9 is a block diagram illustrating an example embodiment of a memory device further including a mirror circuit, according to aspects of the inventive concept.

FIG. 9 is a block diagram illustrating an example embodiment of a memory device further including a mirror circuit, according to aspects of the inventive concept.

Referring to FIG. 9, the circuit it generally as provided in FIG. 8, expect a mirror circuit 600 is disposed between the third switch 320 and the sensing and latch circuit 200. The data current from the third switch 320 is mirrored and the mirrored current is provided to the sensing and latch circuit 200 through the first bit line BL. The current mirror 600 may be configured to prevent a direct current path from the memory cell 400 to the sensing and latch circuit 200. In other words, the mirror circuit 600 may separate a bit line node from a development node. Accordingly, more memory cells may be coupled to a single bit line, as will be discussed in further detail below.

Figure 10:
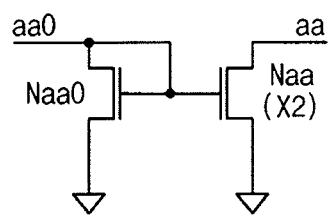
FIG. 10 is a circuit diagram illustrating an example embodiment of a mirror circuit that can form part of the memory device of FIG. 9, according to aspects of the inventive concept.

FIG. 10 is a circuit diagram illustrating an example embodiment of a mirror circuit that can form part of the memory device of FIG. 9, according to aspects of the inventive concept.

Referring to FIG. 10, the mirror circuit 600 may include a first transistor Naa0 and a second transistor Naa that has a size two times greater than that of the first transistor Naa0. Therefore, the second transistor Naa doubles the input current.

As mentioned above, the mirror circuit 600 may prevent a direct current path from the memory cell 400 to the sensing and latch circuit 200. As depicted in FIG. 10, in one embodiment this may take the form wherein the mirror circuit 600 separates the bit line node aa from the development node aa0, and thus the number of the memory cells coupled to the signal bit line may be increased.

Figure 11:
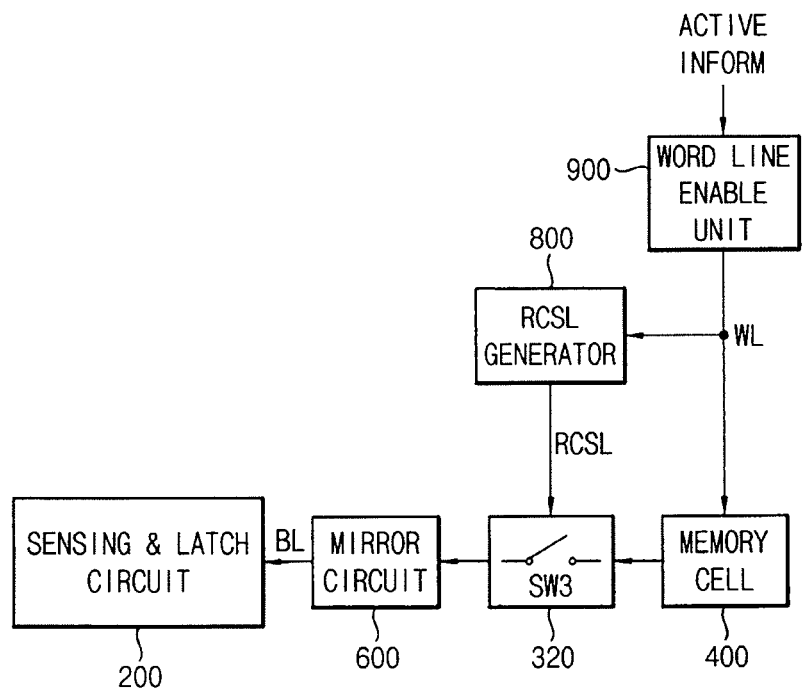
FIG. 11 is a block diagram illustrating a memory device further including a column select signal generator configured to generate a third column select signal, according to aspects of the inventive concept.

FIG. 11 is a block diagram illustrating a memory device further including a column select signal generator configured to generate a third column select signal, according to aspects of the inventive concept.

Referring to FIG. 11, an active information signal is input to the word line enable unit 900 to generate the word line signal WL. The word line enable unit may be, for example, a word line decoder. The word line signal WL is applied to the memory cell to select the memory cell.

The word line signal WL is also provided to a column select signal 800 to generate the third column select signal RCSL for turning on the third switch 320, which may be referred to as an RCSL generator (circuit). For example, the RCSL generator is particularly useful in a reading operation.

Figure 12:
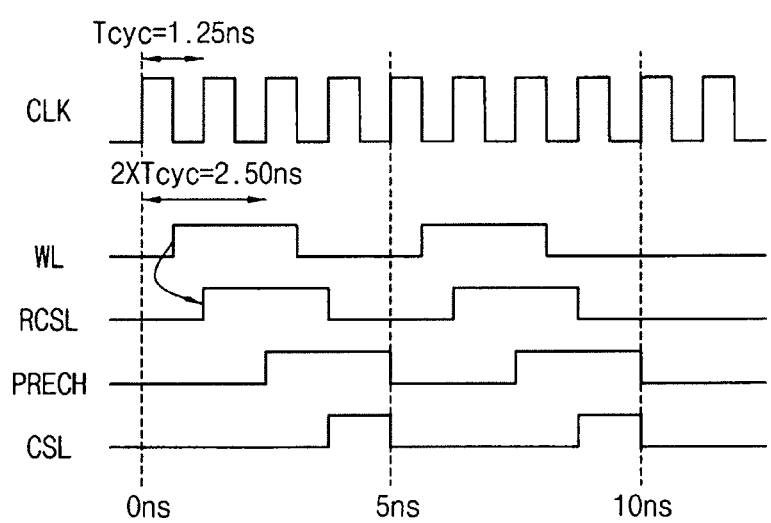
FIG. 12 is a timing diagram illustrating an example embodiment of a read operation of the memory device of FIG. 8, according to aspects of the inventive concept.

FIG. 12 is a timing diagram illustrating an example embodiment of a read operation of the memory device of FIG. 8, according to aspects of the inventive concept.

Referring to FIG. 12, the one clock cycle (Tcyc) may be equal to 1.25 ns (nanoseconds) and the two clock cycles may be 2.5 ns (i.e., 2×Tcyc). The third column select signal RCSL is activated in response to the word line signal WL. A precharge signal PRECH and the first column select signal CSL are input within four cycles of the clock signal CLK, that is, the amplified data by the sensing and latch circuit may be read within 5 ns (i.e., 4×1.25 ns).

Therefore, as demonstrated by the timing diagram of FIG. 12, the RCSL signal is activated by the word line signal WL at 2.5 ns, and then the PRECH and CSL signals can be activated in sequence such that, in accordance with the present embodiment, a read operation can be performed in an MRAM or STT-MRAM to meet DRAM requirements—5 ns.

Figure 13:
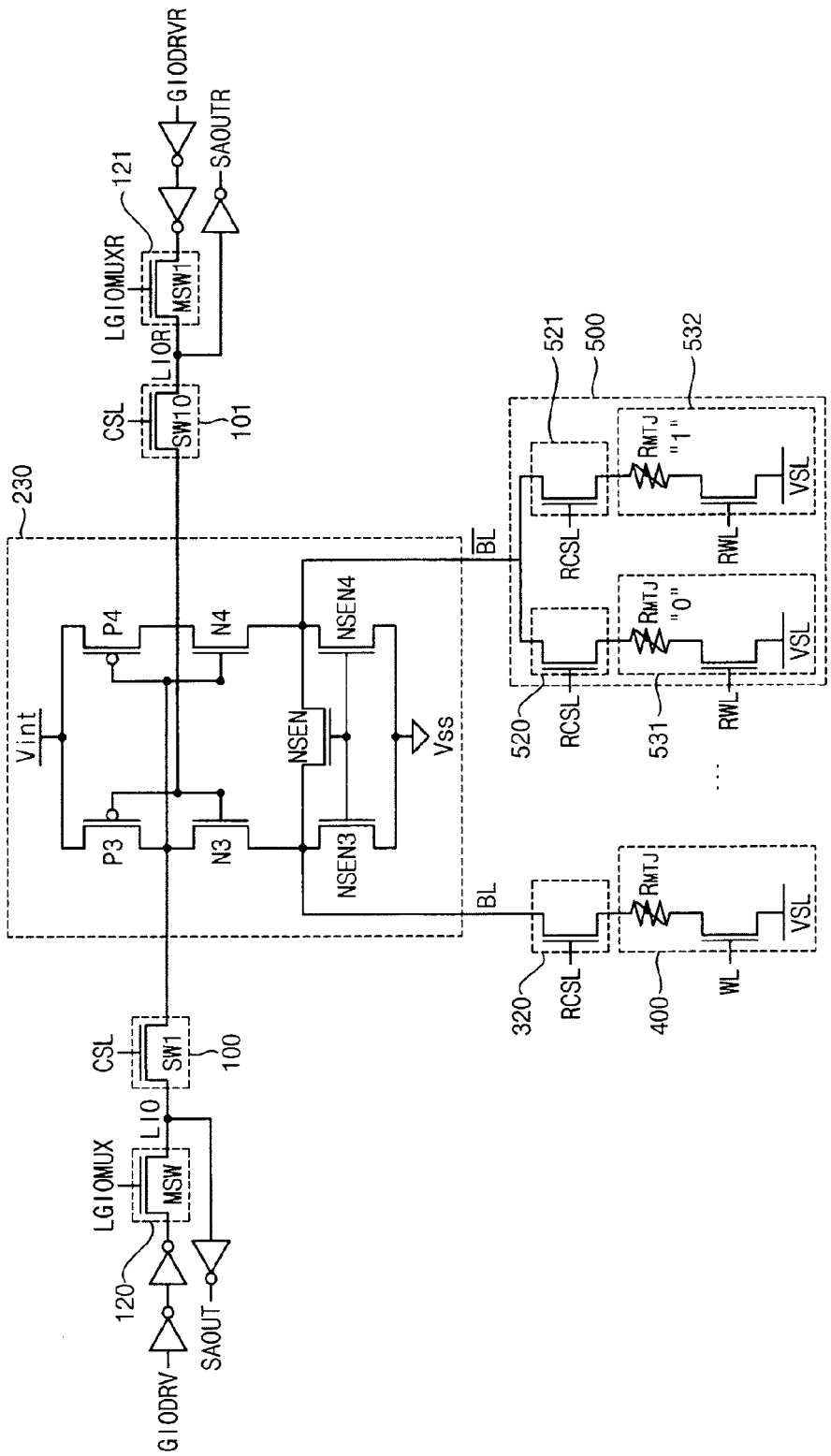
FIG. 13 is a circuit diagram illustrating an example embodiment of a memory device that can be configured to perform a read operation, according to aspects of the inventive concept.

FIG. 13 is a circuit diagram illustrating an example embodiment of a memory device that can be configured to perform a read operation, according to aspects of the inventive concept.

Referring to FIG. 13, a sensing and latch element 230 of the sensing and latch circuit 200 used for the read operation may be implemented with a cross-coupled sense amplifier for data amplification. When the third switch 320 is turned on, the data current corresponding to the data stored in the memory cell 400 is applied to the bit line BL. The reference current is generated by the reference generation circuit 500, and is applied to the complementary bit line BL_bar. The reference current may be the average of the current from the reference memory cell 531 storing the data value "0" and the current from the reference memory cell 532 storing the data value "1" that are applied to the complementary bit line BL_bar when the switches 520 and 521 are turned on in response to the third column select signal RCSL. The data values stored in the reference memory cells 531 and 532 may be complementary to provide the average current. The reference memory cells 531 and 532 may be formed in a portion separated from the memory cell array including the memory cell 400. Also the reference memory cells 531 and 532 may have a size different from the memory cell 400.

The data current on the bit line BL and the reference current on the complementary bit line BL_bar may be compared and the amplified data value based on the comparison result may be provided to the external device through the first switch 100, as described above, and the complementary first switch 101.

The complimentary first switch 101 and corresponding are substantially similar to those provided and described with respect to the first switch 100 and output circuit.

Figure 14:
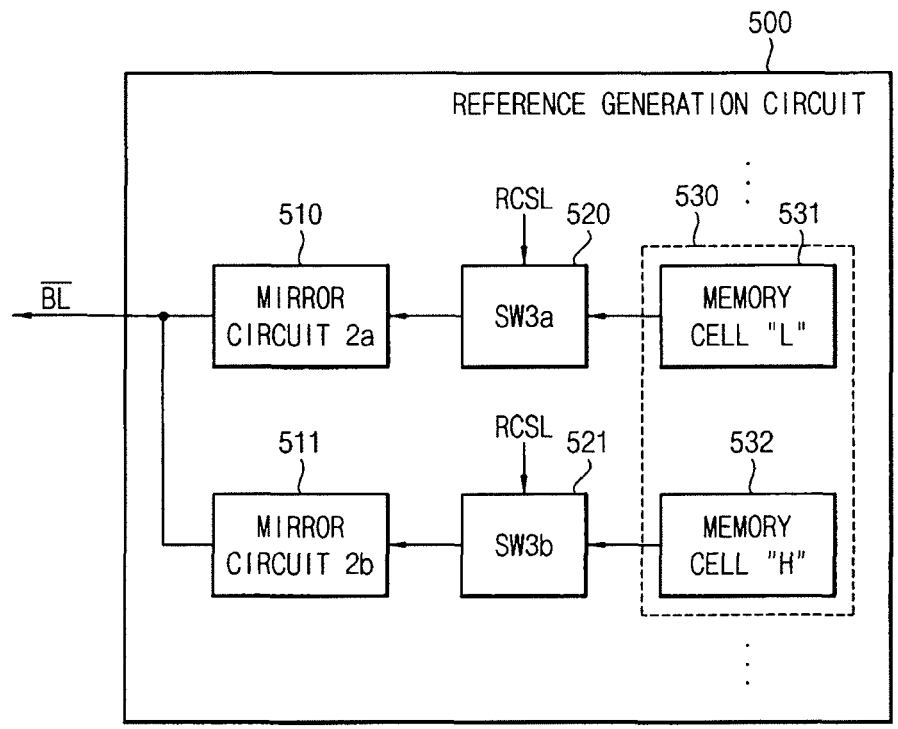
FIG. 14 is a block diagram illustrating an example embodiment of a reference generation unit that can form part of the memory device of FIG. 8, according to aspects of the inventive concept.

FIG. 14 is a block diagram illustrating an example embodiment of a reference generation unit that can form part of the memory device of FIG. 8, according to aspects of the inventive concept.

Referring to FIG. 14, the reference generation circuit 500 generates the reference current that is applied to the complementary bit line BL_bar, as described above. For example, the reference current may be generate using the memory cell 531 storing the data value "0" and the memory cell 532 storing the data value "1," as in FIG. 13. The currents corresponding to the data values "0" and "1" are transferred to the mirror circuits 510 and 511, respectively, when the switches 520 and 521 are turned on in response to the third column select signal RCSL. The reference current on the complementary bit line BL_bar may have an average value of data values "0" and "1" by adjusting the sizes of the transistors in the current mirrors coupled to the complementary bit line BL_bar and the bit line BL.

In some example embodiments, the reference current may be generated using a larger number of the reference memory cells. For example, the reference current on the complementary bit line BL_bar may be generated by using two or more transistors storing the data value "0" and two or more transistors storing the data value "1". The number of transistors storing the data value "0" is the same as the number of the transistors storing the data value "1," in various presently preferred embodiments.

Low data "L" and high data "H" of the two references are read by word line selection. The average level between "0" and "1" data values is supplied to the bit line BL_bar through the 3$^{rd}$ switch 520, 521 and mirror circuit 510, 511, wherein the third switch 520, 521 is turned on by RCSL.

Figure 15:
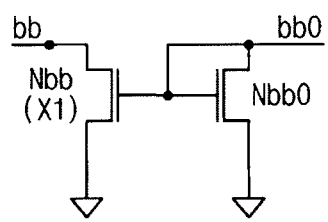
FIG. 15 is a circuit diagram illustrating an example embodiment of a mirror circuit that can form part of the reference generation unit of FIG. 14, according to aspects of the inventive concept.

FIG. 15 is a circuit diagram illustrating an example embodiment of a mirror circuit that can form part of the reference generation unit of FIG. 14, according to aspects of the inventive concept.

Referring to FIG. 15, a mirror circuit 510 may include a first transistor Nbb0 and a second transistor Nbb that has the same size as the first transistor Naa0. The current applied to the node bb may be the same as the current applied to the node bb0, due to two transistors Nbb and Nbb0 having the same size. Through the mirror circuit 510, the signal distortion on the complementary bit line BL_bar coupled to the sensing and latch circuit may be compensated for. In case that one memory cell storing the data value "0 and one memory cell storing the data value "1" are used to generate the reference current, the transistor Naa in FIG. 10 may have a size two times greater than the size of the other transistors Naa0, Nbb and Nbb0 in FIGS. 10 and 15.

Figure 16:
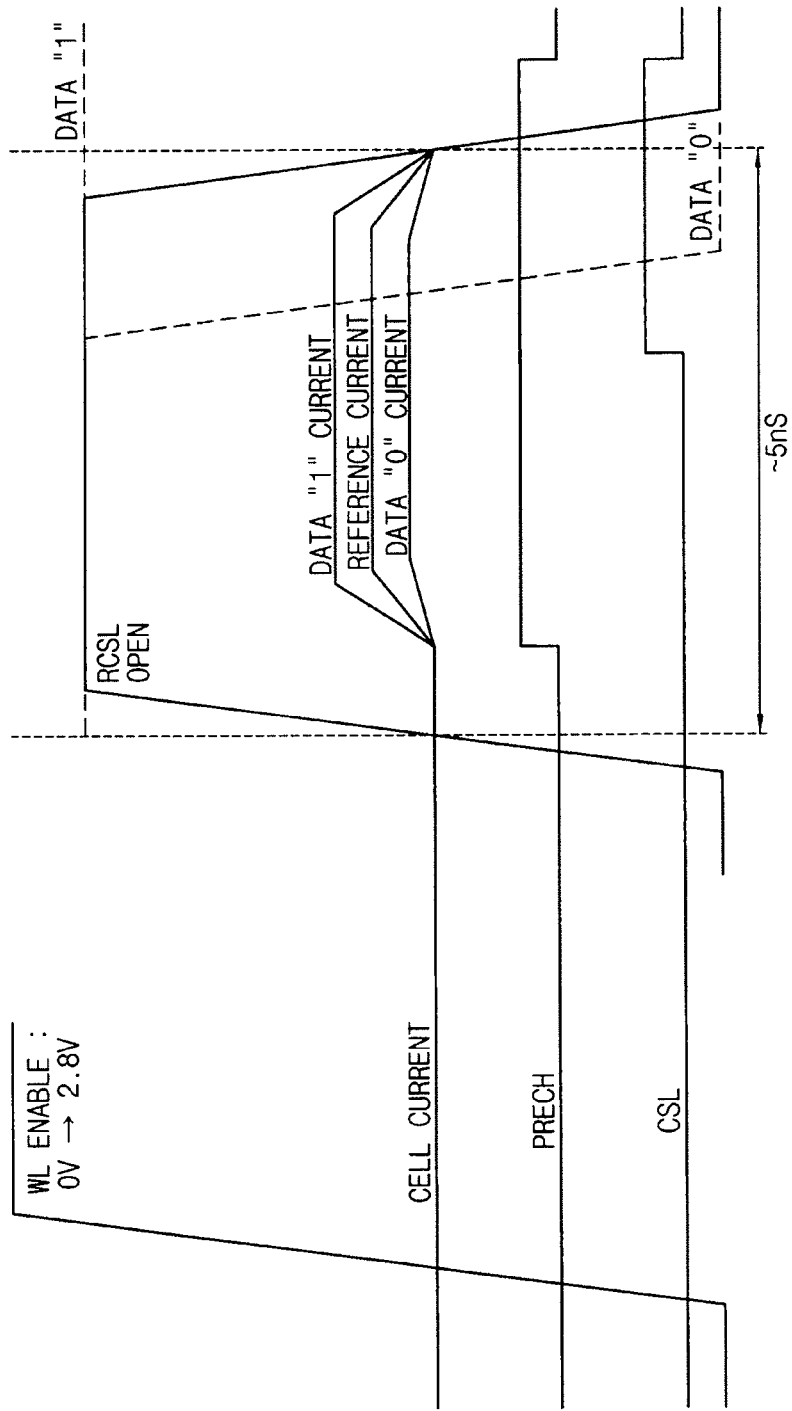
FIG. 16 is a timing diagram useful for describing an example embodiment of a read operation of the memory device of FIG. 8, according to aspects of the inventive concept.

FIG. 16 is a timing diagram useful for describing an example embodiment of a read operation of the memory device of FIG. 8, according to aspects of the inventive concept.

Referring to FIG. 16, when the word line is enabled, the word line voltage is changed from 0V to 2.8V, and the memory cell is selected for the read operation. The data current may be applied to the bit line BL when the third column select signal RCSL is activated (OPEN). The data current may be DATA "1" CURRENT or DATA "0" CURRENT depending on the data value stored in the memory cell. At the same time, the REFERENCE CURRENT is applied to the complementary bit line BL_bar as described above. The pre-charge signal PRECH is deactivated in the logic high level to quit the pre-charge operation. The amplified signal DATA"0" or DATA"1," provided by the sensing and latch circuit, is provided to an external device when the first column select signal CSL is activated. Such read operation may be preformed in not more than 5 ns.

Therefore, the word line signal WL selects a memory (e.g., MRAM) cell and then RCSL is open. After comparing with the reference current data "1" and data "0" is developed. The bit line BL is pre-charged with the charge signal PRECH after opening RCSL. The developed data is output by CSL activation. As a result, the data read operations, using the sensing and latch circuit 200 in a sensing mode, may be completed in not more that 5 ns, e.g., the DRAM requirement.

Figure 17:
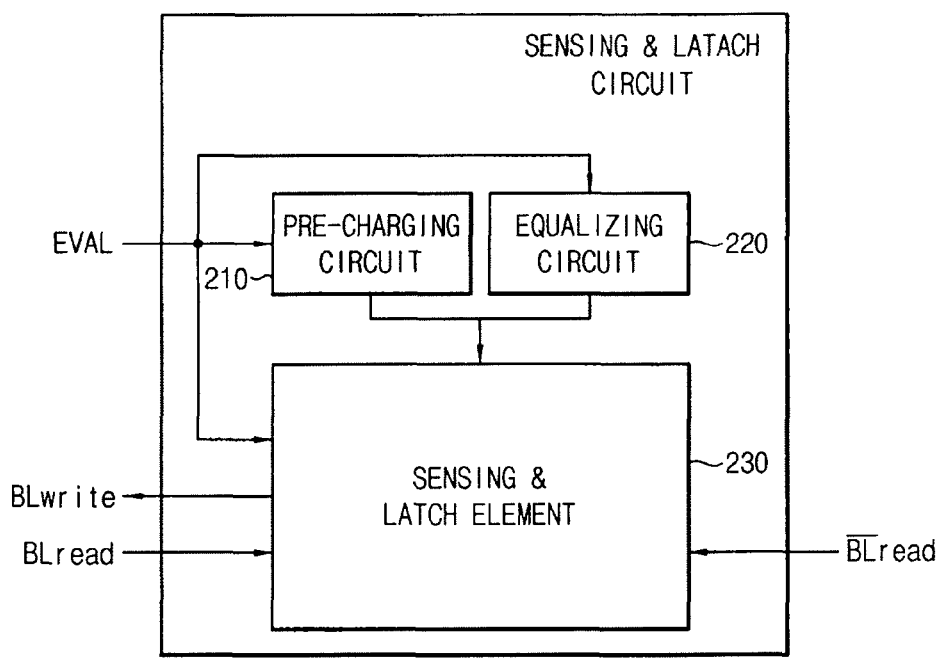
FIG. 17 is a block diagram illustrating an example embodiment of a sensing and latch circuit that can form part of a memory device, according to aspects of the inventive concept.

FIG. 17 is a block diagram illustrating an example embodiment of a sensing and latch circuit that can form part of a memory device, according to aspects of the inventive concept.

Referring to FIG. 17, the sensing and latch circuit 200 may include a pre-charging circuit 210, an equalizing circuit 220, and the sensing and latch element 230. The activation signal EVAL can be applied to the pre-charging circuit 210, the equalizing circuit 220, and the sensing and latch element 230. The pre-charging circuit 210 and the equalizing circuit 220 are coupled to the sensing and latch element 230 to pre-charge the bit lines BLwrite, BLread and BLread_bar. The sensing and latch element 230 is coupled to the bit line BLwrite for the write operation and the bit lines BLread and BLread_bar for the read operation. Preferably, BLwrite for the write operation and BLread for the read operation are separated, e.g., physically distinct bit lines.

Figure 18:
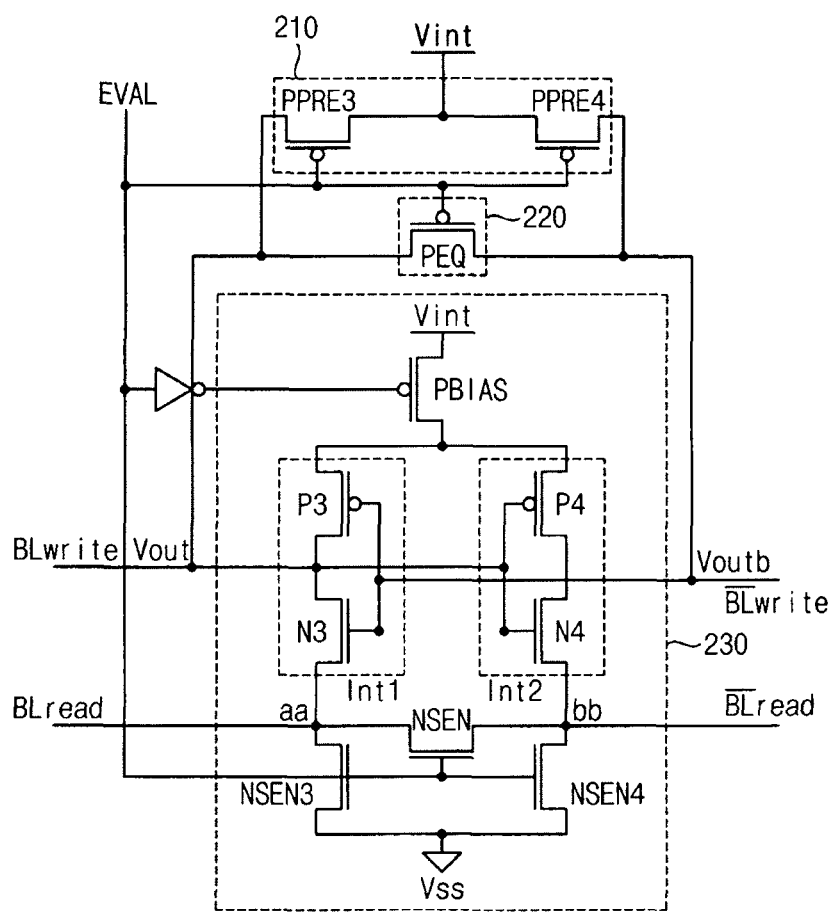
FIG. 18 is a circuit diagram illustrating an example embodiment of the sensing and latch circuit of FIG. 17, according to aspects of the inventive concept.

FIG. 18 is a circuit diagram illustrating an example embodiment of the sensing and latch circuit of FIG. 17, according to aspects of the inventive concept.

Referring to FIG. 18, the pre-charging circuit 210 may include two PMOS transistors PPRE3 and PPRE4 that are turned on in response to the activation signal EVAL applied to the gates of the PMOS transistors PPRE3 and PPRE4. The pre-charging circuit 210 may be coupled to the write bit line BLwrite and the complementary write bit line BLwrite_bar to apply the pre-charge voltage or current. The equalizing circuit 220 may include one PMOS transistor PEQ that is turned on the activation signal EVAL. The sensing and latch element 230 may include cross-coupled positive feedback inverters. That is, the inverter Int1 including the transistors P3 and N3 and the inverter Int2 including the transistors P4 and N4 are cross-coupled. The output node (Vout) may be disposed between the transistors P3 and N3, and the amplification operation and the write operation may be performed through the output node. The complementary output node (Voutb) may be disposed between the transistors P4 and N4. For the read operation, the read bit line BLread is coupled to the aa node in FIG. 10 and the complementary read bit line BLread_bar is coupled bb node in FIG. 15. In the sensing and latch element 230, the transistor PBIAS coupled to the power supply voltage Vint and the transistors NSEN3 and NSEN4 coupled to the ground voltage Vss are turned on in response to the activation signal EVAL.

For example, the sensing and latch circuit 200 may use the inverters Int1 and Int2 as the latch circuit to operate in the voltage mode in the write operation. In the read operation, the sensing and latch circuit 200 may perform a current sensing operation by comparing the currents at the aa node coupled to the read bit line BLread and the bb node coupled to the complementary read bit line BLread_bar.

Figure 19A:
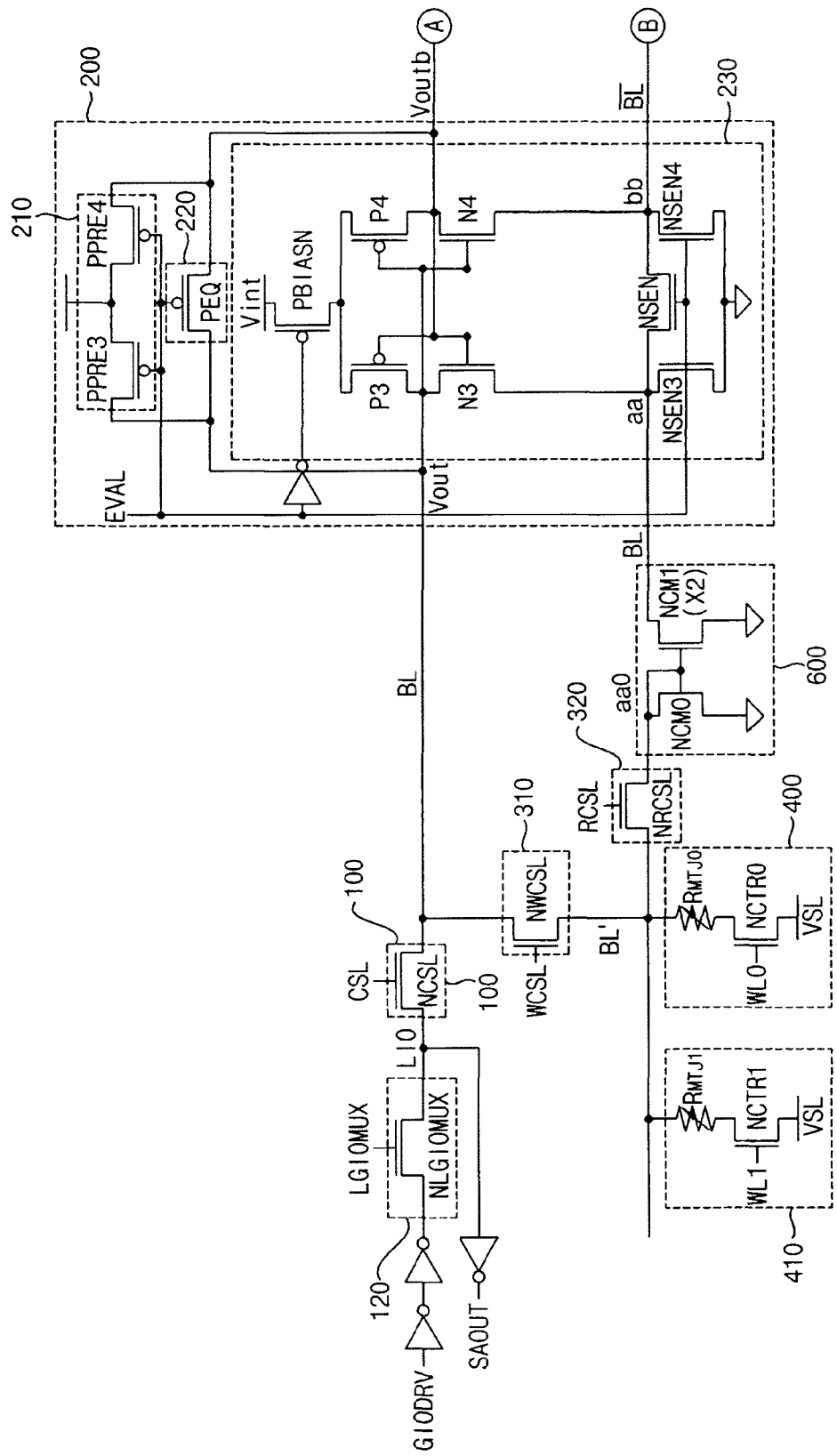
FIGS. 19A and 19B are circuit diagrams illustrating an example embodiment of a memory device that can be configured to perform a write operation and a read operation, according to aspects of the inventive concept.
Figure 19B:
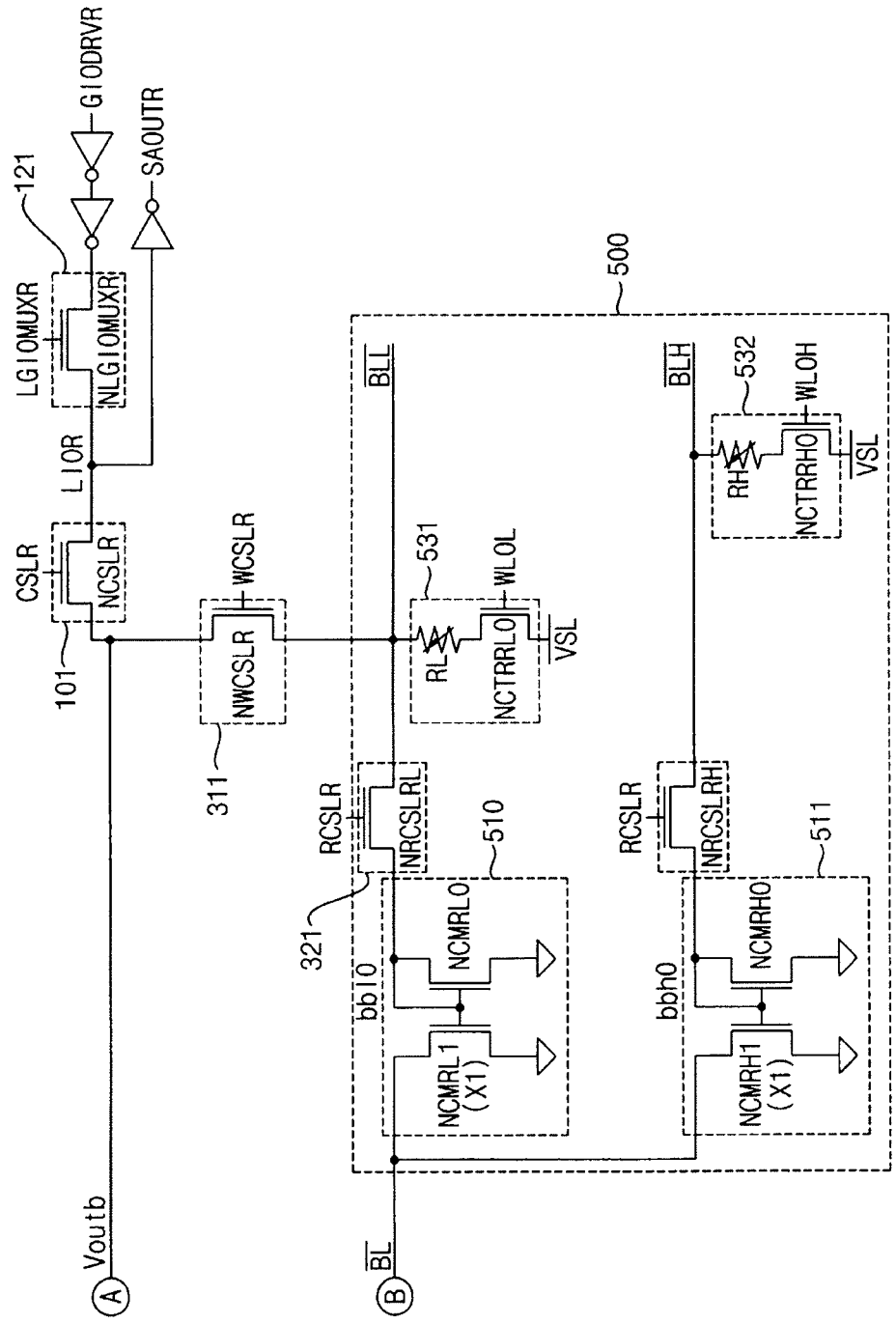

FIGS. 19A and 19B are circuit diagrams illustrating an example embodiment of a memory device that can be configured to perform a write operation and a read operation, according to aspects of the inventive concept. The repeated descriptions with above-described figures may be omitted.

Referring to FIGS. 19A and 19B, the memory device may include the switches on the write and read paths, the sensing and latch circuit 200, the reference generation circuit 500 and the memory cells 400 and 410.

In a write operation, the write data may be transferred to the sensing and latch circuit 200 through the NCSL transistor, that is, the first switch 100. The data value stored temporarily in the sensing and latch circuit 200 may be transferred to the memory cell 400 through the NWCSL transistor, that is, the second transistor 310. The sensing and latch circuit 200 may be the same as described with reference to FIG. 18. Through the NWCSL transistor 310 operating in response to the second column select signal WCSL, the write data may be written in the memory cell 400 selected by the word line WL0. The memory cells 400 and 401 are coupled commonly to the bit line BL'. The memory cells 400 and 401 may be resistive memory cells. The resistive memory cells may include STT-MRAM cells having vertical or horizontal magnetizing direction, PRAM cells and FeRAM cells, as examples.

In a read operation, the data stored in the selected memory cell 400 may be transferred to the sensing and latch circuit 200 through the NRCSL transistor, that is, the third switch 320, and the mirror circuit 600. As described above, the third switch 320 may be turned on in response to the third column select signal RCSL. The mirror circuit 600 may be the same as described with reference to FIG. 10. The data current corresponding to the data stored in the memory cell is applied to the aa node through the bit line BL. The data current at the aa node is compared with the reference current at the bb node applied through the complementary bit line BL_bar. The reference current is generated by the reference generation circuit 500 as described with reference to FIGS. 13, 14 and 15. The reference select signal RCSLR may be the same as or different from the third column select signal RCSL. The data amplified by the sensing and latch circuit 200 may be transferred to the external device through the first switch 100 and the complementary first switch 101.

Figure 20:
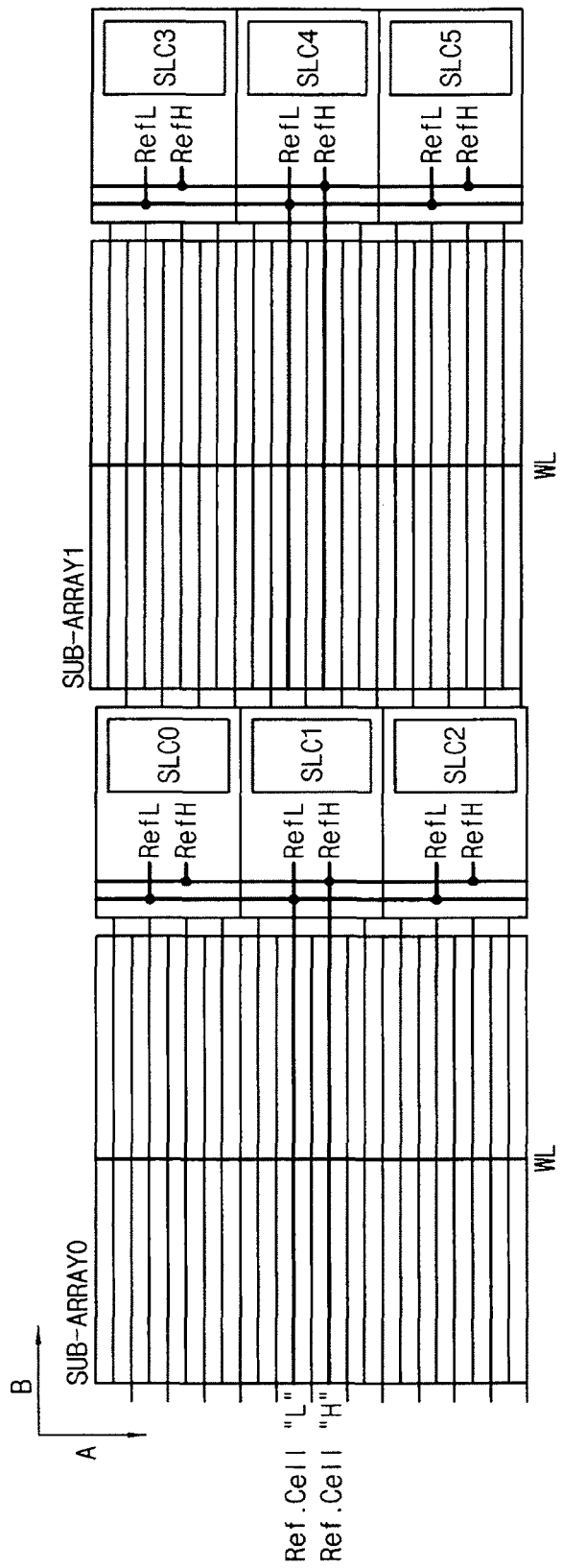
FIG. 20 is a diagram illustrating an example embodiment of an array layout structure of a memory device, according to aspects of the inventive concept.

FIG. 20 is a diagram illustrating an example embodiment of an array layout structure of a memory device, according to aspects of the inventive concept.

Referring to FIG. 20, the reference cells may be disposed on the center portion of the sub-array0 along a direction B, as shown. In other example embodiments, the reference cells may be disposed on upper and bottom portions of the sub-array0. A word line WL is disposed in a direction A, which is different from direction B. In various embodiments, direction A may be substantially perpendicular to direction B. And in various embodiments, word line WL may be substantially disposed within sub-array0.

A first low (Ref. Cell "L") of the reference cells storing the data value "0" and a second low (Ref. Cell "H") of the reference cells storing the data value "1" are illustrated in FIG. 20. In other embodiments, a plurality of the "0" reference cells and a plurality of the "1" reference cells may be disposed. When the one word line WL is enabled, the reference cells and the memory cells commonly coupled to the enabled word line WL are selected simultaneously and the data currents and the reference currents may be transferred to the sensing and latch circuits SLC0, SLC1 and SLC2. The reference currents RefL and RefH may be shared by the sensing and latch circuits SLC0, SLC1 and SLC2 through the vertical common reference lines, disposed in direction A.

The sub-array1 next to the sub-array0 may have same configuration as the sub-array0.

Figure 21A:
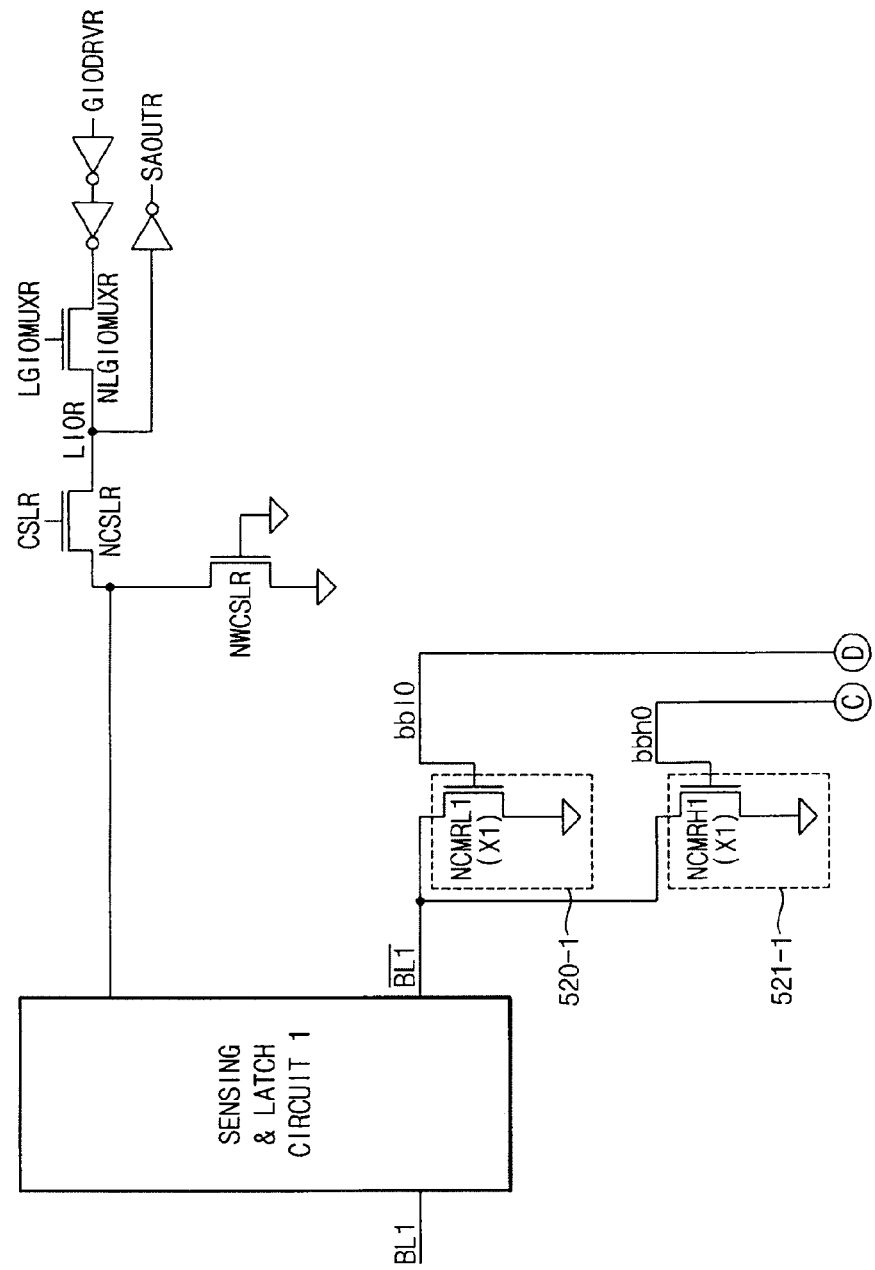
FIGS. 21A and 21B are circuit diagrams illustrating an example embodiment of a connection between sensing and latch circuits, according to aspects of the inventive concept.
Figure 21B:
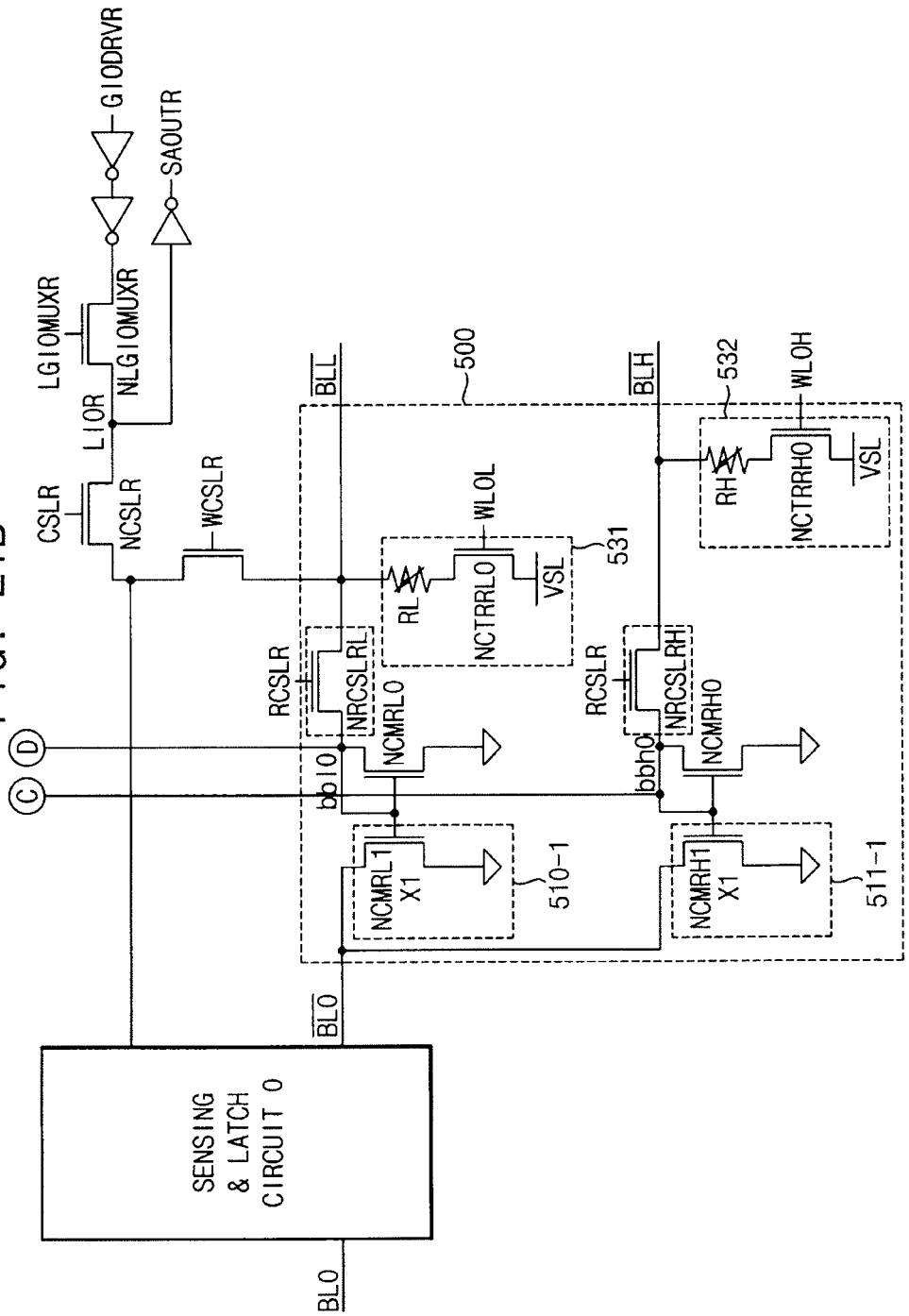

FIGS. 21A and 21B are circuit diagrams illustrating an example embodiment of a connection between sensing and latch circuits, according to aspects of the inventive concept.

As an example, two sensing and latch circuits are illustrated in FIGS. 21A and 21B, sensing and latch circuit0 and sensing and latch circuit1. The sensing and latch circuit0 is directly coupled to the reference generation circuit 500 to receive the reference current through the complementary bit line BL0_bar. Also the sensing and latch circuit1 is coupled to the reference generation circuit 500 through the half-mirror portions 520-1 and 521-1. The NCMRL1 transistor in the portion 520-1 is coupled to the bbl0 node between the portion 510-1 and the NCMRL0 transistor, to receive the "L" reference current. The NCMRH1 transistor in the portion 521-1 is coupled to the bbh0 node between the portion 511-1 and the NCMRH0 transistor, to receive the "H" reference current. As such, the reference generation circuit 500 may be shared by the plurality of sensing and latch circuits. The mirrored portions 510-1 and 511-1 are disposed near the sensing and latch circuit0 and the mirrored portions 520-1 and 521-1 are disposed near the sensing and latch circuit1.

Figure 22:
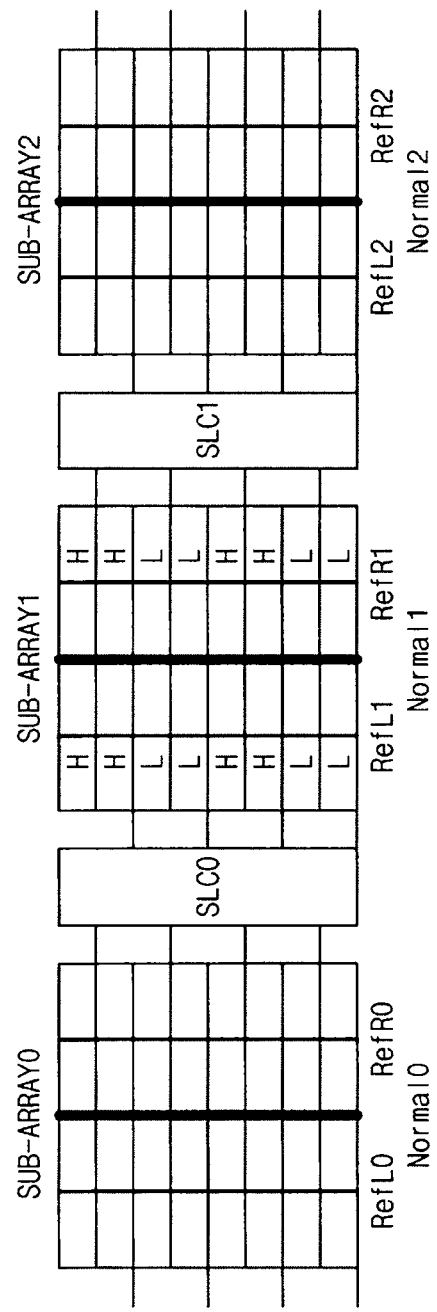
FIG. 22 is a diagram illustrating an example embodiment of an array layout of a memory device configured to simultaneously enable two word lines, according to aspects of the inventive concept.

FIG. 22 is a diagram illustrating an example embodiment of an array layout of a memory device configured to simultaneously enable two word lines, according to aspects of the inventive concept.

Referring to FIG. 22, one normal word line Normal0 and the two reference word lines RefL0 and RefR0 are illustrated in the sub-array0. The two reference word lines Ref0 and RefR0 may be selected respectively. The sub-array1 and the sub-arry2 may have the same configuration as the sub-array0. For example, when the normal word line Normal0 in the sub-array0 is selected, the reference word lines RefL1 and RefR1 in the sub-array1 may be selected simultaneously. The reference cells coupled to the respective reference word lines have the same number of the "L" reference cells and the "H" reference cells. For example, both of the left reference word line RefL1 and the right reference word line RefR1 may be coupled to the four "L" reference cells and the four "H" reference cells, respectively, as illustrated in FIG. 22. The reference current on the complementary bit line may be the average value of the "H" data current and the "L" data current. The sensing and latch circuit SLC0 may be disposed between the sub-array0 and the sub-array1 and the sensing and latch circuit SLC1 may be disposed between the sub-array1 and the sub-array2. The sensing and latch circuits SLC0 and SLC1 may have the structure of the open bit line sense amplifier.

Figure 23:
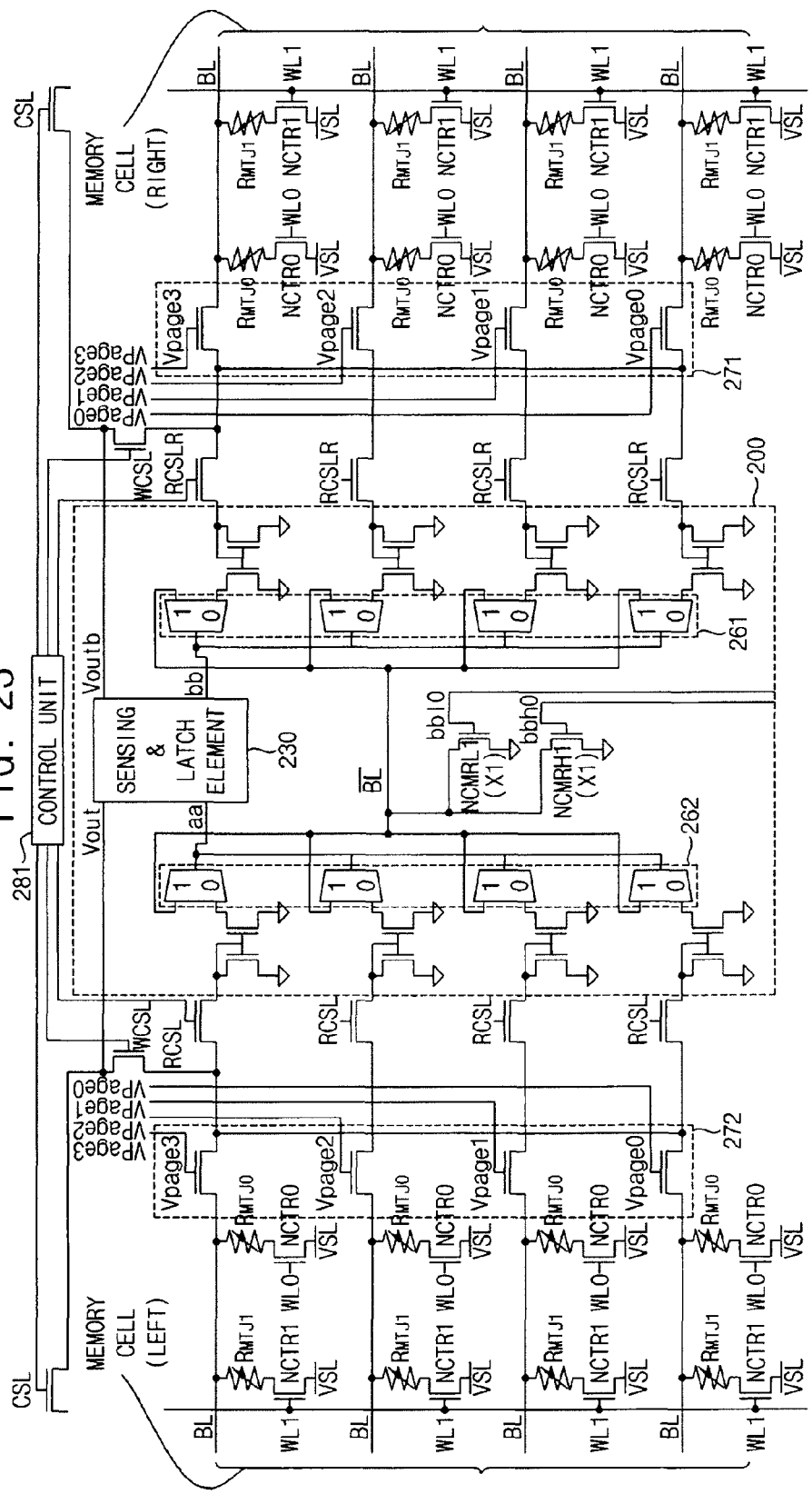
FIG. 23 is a circuit diagram illustrating an example embodiment of a sensing and latch circuit coupled to a plurality of bit lines, according to aspects of the inventive concept.

FIG. 23 is a circuit diagram illustrating an example embodiment of a sensing and latch circuit coupled to a plurality of bit lines, according to aspects of the inventive concept.

Referring to FIG. 23, the eight bit lines BL may be coupled to the one sensing and latch circuit 200. When the write or read operation is performed with respect to the memory cells disposed in the left side of the sensing and latch circuit 200, the left selection circuit 262 may be enabled. According to the page select signals VPage0 through VPage4, the switches in the portion 272 may be sequentially turned on and the data from or to the left bit lines may be sequentially transferred to or from the sensing and latch circuit 200. When the write or read operation is performed with respect to the memory cells disposed in the right side of the sensing and latch circuit 200, the right selection circuit 261 may be enabled. In this embodiment, 261, 262 select one of the bit line and bit line bar. Vpage0 through Vpage3 selects one bit line from the four bit lines. According to the page select signals VPage0 through VPage4, the switches in the portion 271 may be sequentially turned on and the data from or to the right bit lines may be sequentially transferred to or from the sensing and latch circuit 200. The complementary bit line BL_bar may provide the reference current to the sensing and latch element 230 according to the operation of the selection signals 261 and 262. The control unit 281 controls timings of the write operation and the read operation.

Figure 24:
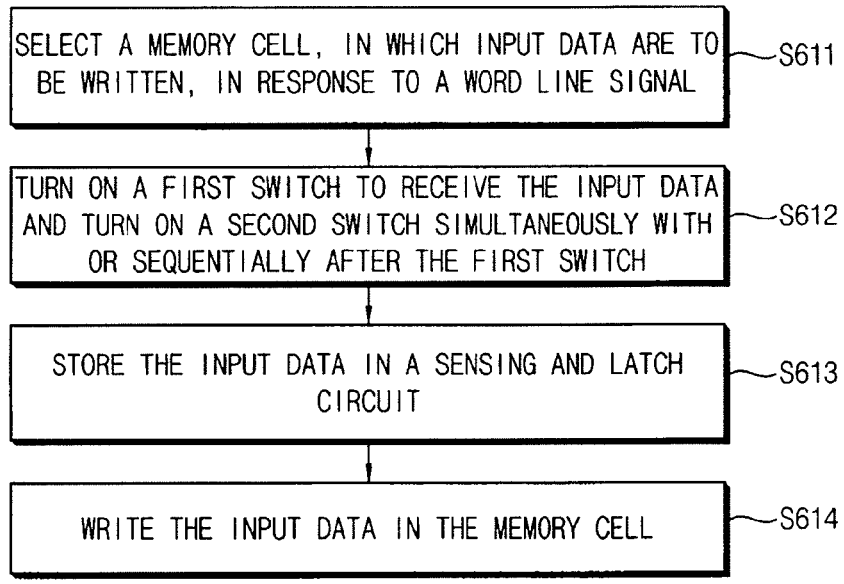
FIG. 24 is a flowchart illustrating an example embodiment of a method of performing a write operation in a memory device, according to aspects of the inventive concept.

FIG. 24 is a flowchart illustrating an example embodiment of a method of performing a write operation in a memory device, according to aspects of the inventive concept.

Referring to FIG. 24, according to the write operation method, a memory cell, in which input data are to be written, is selected in response to a word line signal (S611). A first switch is turned on to receive the input data and a second switch is turned on simultaneously with or sequentially after the first switch (S612). The input data are stored in a sensing and latch circuit (S613). And the input data are written in the memory cell (S614).

Figure 25:
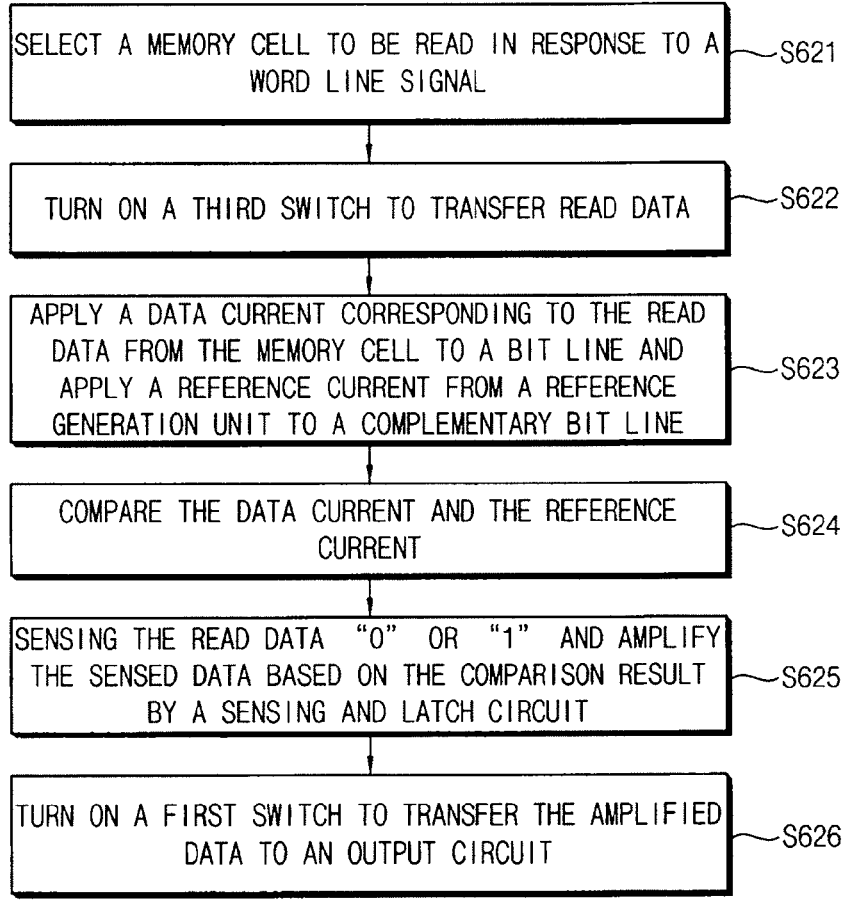
FIG. 25 is a flowchart illustrating an example embodiment of a method of performing a read operation in a memory device, according to aspects of the inventive concept.

FIG. 25 is a flowchart illustrating an example embodiment of a method of performing a read operation in a memory device, according to aspects of the inventive concept.

Referring to FIG. 25, a memory cell to be read is selected in response to a word line signal (S621). A third switch is turned on to transfer read data (S622). A data current corresponding to the read data from the memory cell is applied to a bit line and a reference current from a reference generation unit is applied to a complementary bit line (S623). The cell current and the reference current are compared (S624). The read data "0" or "1" are sensed and the sensed data are amplified based on the comparison result by a sensing and latch circuit (S625). A first switch is turned on to transfer the amplified data to an output circuit (5626).

Figure 26:
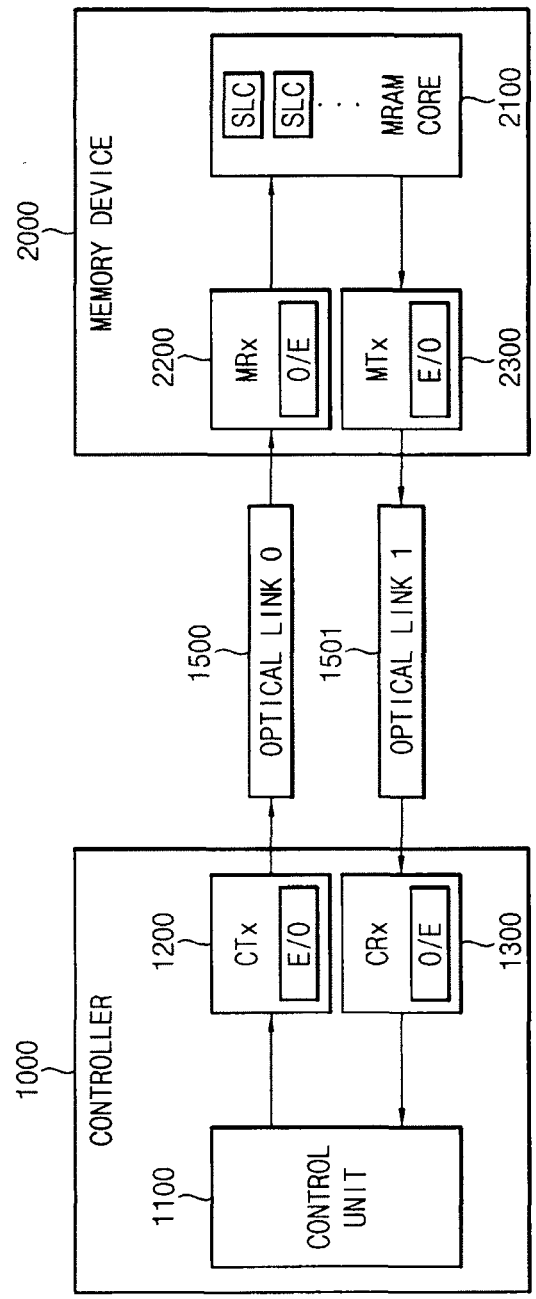
FIG. 26 is a block diagram illustrating an example embodiment of a memory system in which a memory device and a memory controller are coupled through optical links, according to aspects of the inventive concept.

FIG. 26 is a block diagram illustrating an example embodiment of a memory system in which a memory device and a memory controller are coupled through optical links, according to aspects of the inventive concept.

Referring to FIG. 26, a memory system may include a controller 1000 and a memory device 2000. The controller 1000 may include a control unit 1100, a transmitting interface 1200 and a receiving interface 1300. The transmitting interface 1200 may include an electrical-to-optical converter E/O and the receiving interface 1300 may include an optical-to-electrical converter O/E. The memory device 2000 may include an MRAM core 2100, including sensing and latch circuits (SLC) according to example embodiments, a receiving interface 2200 and a transmitting interface 2300. The receiving interface 2200 may include an optical-to-electrical converter O/E and the transmitting interface 2300 may include an electrical-to-optical converter E/O. The controller 1000 and the memory device 2000 may be coupled through optical links 1500 and 1501 to perform optical communications. The optical links 1500 and 1501 can be two uni-directional links, as illustrated in FIG. 26, which may be replaced with one bi-directional link in other embodiments.

FIGS. 27A through 27D are diagrams illustrating example embodiments of memory systems having various interfaces, according to aspects of the inventive concept.

Figure 27A:
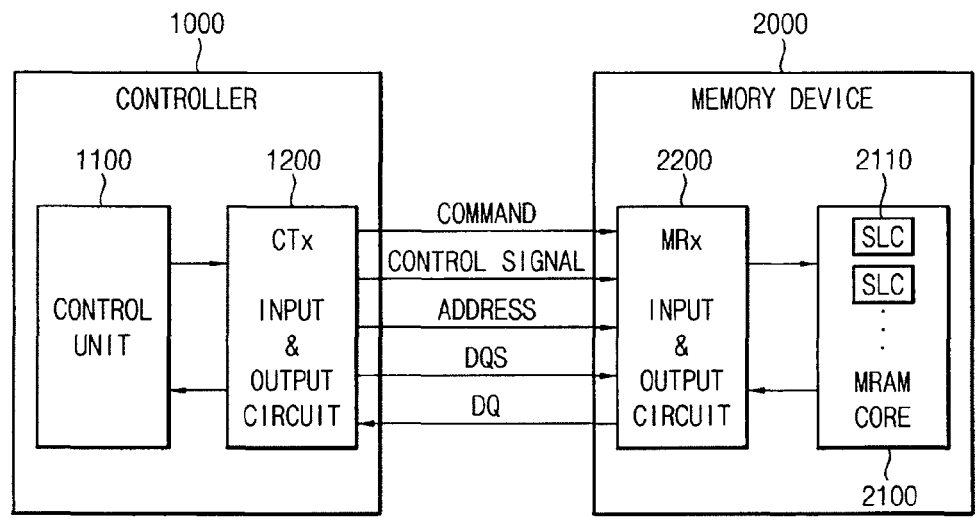
FIGS. 27A through 27D are diagrams illustrating example embodiments of memory systems having various interfaces, according to aspects of the inventive concept.

Referring to FIG. 27A, a memory system may include a controller 1000 and a memory device 2000. The controller 1000 may include a control unit 1100 and an input and output circuit 1200. The memory device 2000 may include an MRAM core 2100 including sensing and latch circuits (SLC) 2110, according to example embodiments, and an input and output circuit 2200. The controller 1000 may transmit the command, the control signal, the address and the data strobe signal DQS. The data DQ may be exchanged between the controller 1000 and the memory device 2000.

Figure 27B:
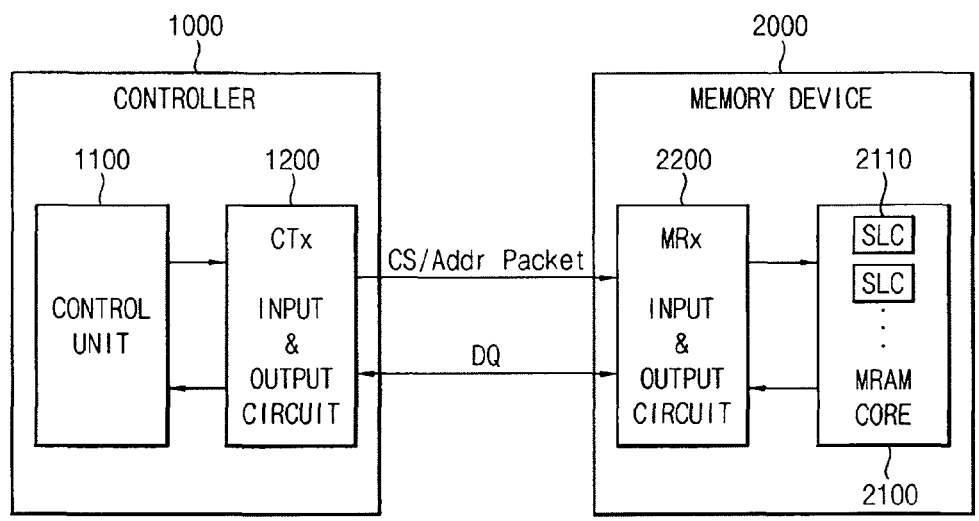

Referring to FIG. 27B, the controller 1000 may transmit a chip selection signal CS and the address Addr as a packet to the memory device 2000. The data DQ may be exchanged between the controller 1000 and the memory device 2000.

Figure 27C:
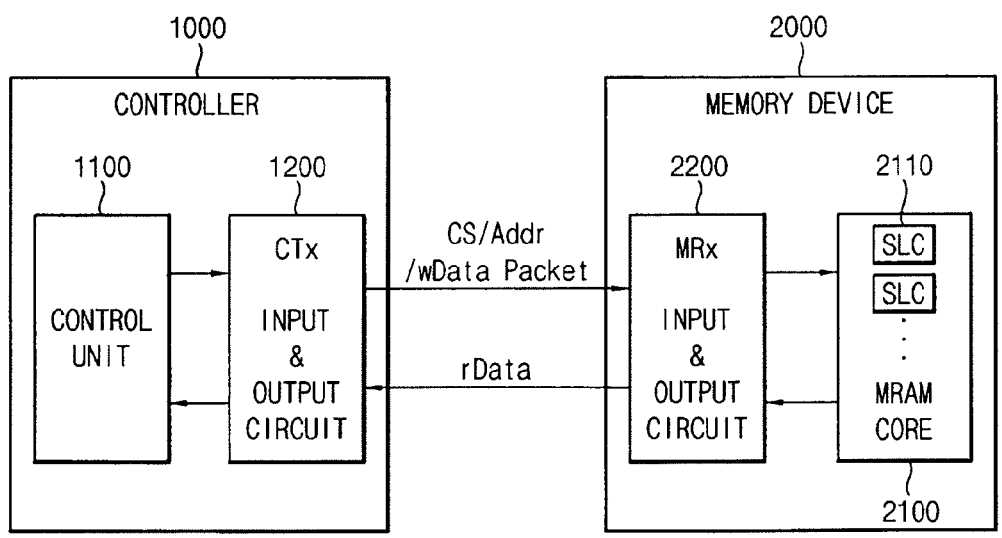

Referring to FIG. 27C, the controller 1000 may transmit the chip selection signal CS, the address Addr and the write data wData as a packet to the memory device 2000. The memory device 2000 may transmit the read data rData to the controller 1000 through the dedicated data line, not as a packet.

Figure 27D:
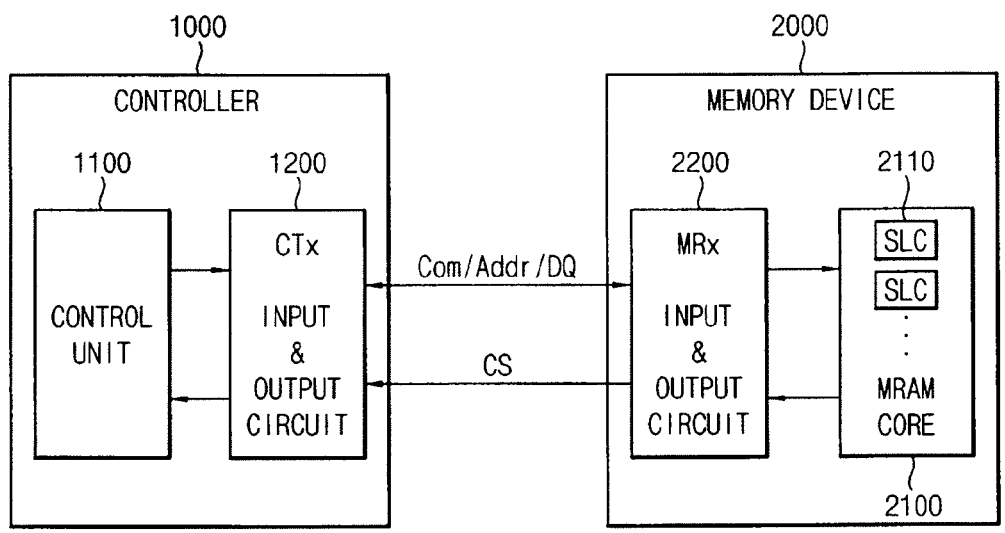

Referring to FIG. 27D, the command Com, the address Addr and the data DQ may be exchanged between the controller 1000 and the memory device 2000. The memory device 2000 may transmit the chip selection signal CS to the memory controller 1000 through the dedicated control line.

Figure 28:
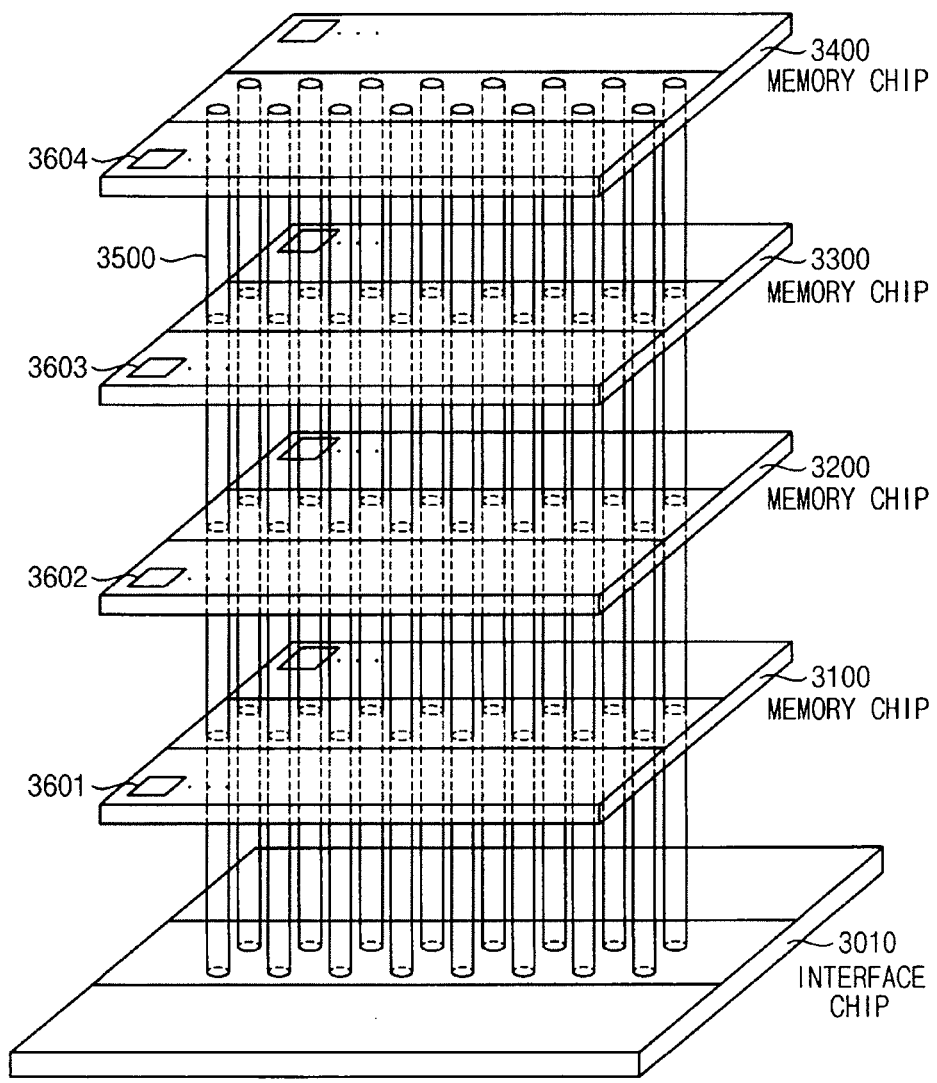
FIG. 28 is a diagram illustrating an example embodiment of a memory system in which a plurality of memory chips are stacked using through-silicon vias (TSVs), according to aspects of the inventive concept.

FIG. 28 is a diagram illustrating an example embodiment of a memory system in which a plurality of memory chips are stacked using through-silicon vias (TSVs), according to aspects of the inventive concept.

Referring to FIG. 28, an interface chip 3010 may be disposed in the lowest layer and a plurality of memory chips 3100, 3200, 3300 and 3400 may be stacked thereon. The memory chips 3100, 3200, 3300 and 3400 include the sensing and latch circuits 3601, 3602, 3603 and 3604 according to example embodiments, respectively. The adjacent memory chips may be connected through micro-bumps 3500 and the through-silicon vias may be formed in memory chip.

In some embodiments, one memory chip 3100 may be disposed on the interface chip 3010. In other embodiments, the plurality of the memory chips 3100-3400, and beyond, may be sequentially stacked, as illustrated in FIG. 28.

Figure 29:
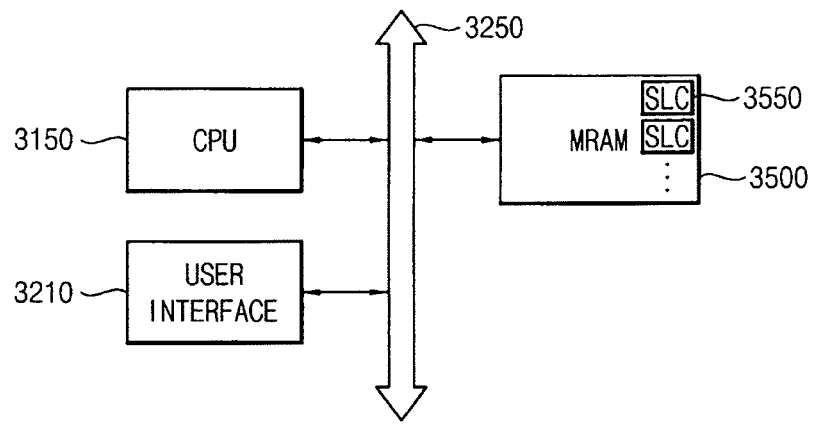
FIG. 29 is a diagram illustrating an example embodiment of a memory system in which a memory device is coupled to a system bus, according to aspects of the inventive concept.

FIG. 29 is a diagram illustrating an example embodiment of a memory system in which a memory device is coupled to a system bus, according to aspects of the inventive concept.

Referring to FIG. 29, a memory system may comprise a central processing unit (CPU) 3150, a user interface 3210, and an MRAM 3500 including at least one sensing and latch circuit 3550, according to example embodiments, coupled through a system bus 3250.

Figure 30:
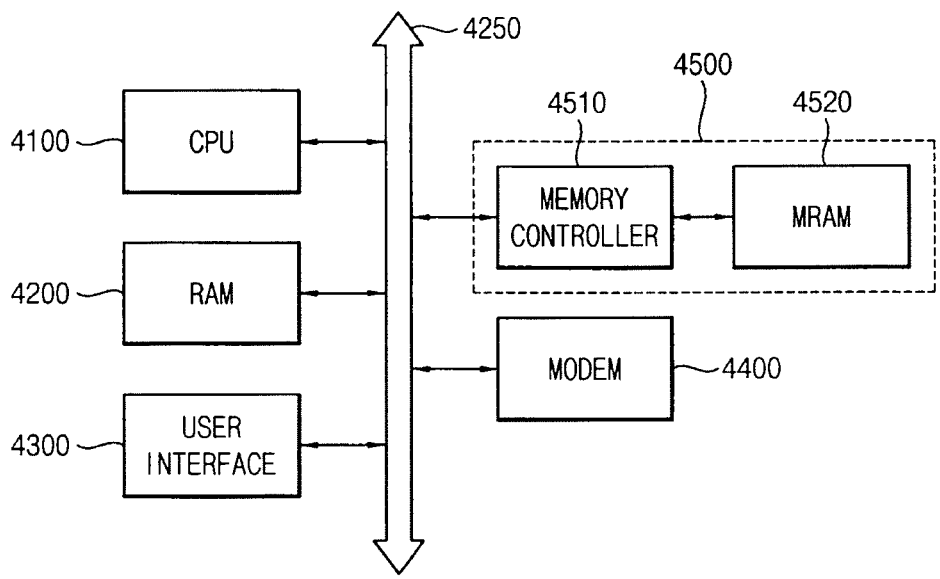
FIG. 30 is a diagram illustrating another example embodiment of a memory system in which a memory device is coupled to a system bus, according to aspects of the inventive concept.

FIG. 30 is a diagram illustrating another example embodiment of a memory system in which a memory device is coupled to a system bus, according to aspects of the inventive concept.

Referring to FIG. 30, a memory system may comprise a central processing unit (CPU) 4100, a random access memory (RAM) 4200, a user interface 430, a modem 4400 and a memory device 4500 coupled through a system bus 4250. The memory device 4500 may include a memory controller 4510 and an MRAM 4500 including at least one sensing and latch circuit according to example embodiments.

As examples, a memory device, apparatus, or system in accordance with the inventive concept may be a standalone memory device, system, or apparatus capable of interfacing with another device, system, or apparatus or such memory device, system, or apparatus may form part of another (external) device, system, or apparatus. For example, a memory device, system or apparatus in accordance with the inventive concept may form part of a mobile or portable device, e.g., cellular telephone, electronic tablet, laptop computer, remote control, camera or video recorder, navigation device, or any of a variety of special purpose handheld devices. In various embodiments, a memory device, system or apparatus in accordance with the inventive concept may form part a more stationary or non-mobile device, e.g., a personal computer, workstation, computer server, modem, router, or other network appliance, entertainment system component, household appliance, vehicle, and so on. In short, there are no inherent limitations on the types of devices, systems, or apparatuses that a memory device, system, or apparatus in accordance with the present apparatus may be used with or form part of.

As described above, the memory device including the STT-MRAM cells may have the write operation speed as rapid as the DRAM, and may perform page open operation in the read operation to provide performance comparable to performance of the DRAM.

Additionally, while the memory device in the example embodiments above was an MRAM memory device or STT-MRAM memory device, in other embodiments the memory device could be a dynamic random access memory (DRAM), phase change random access memory (PRAM), resistive random access memory (RRAM), or a NAND flash memory.

The foregoing is illustrative of example embodiments and is not to be construed as limiting thereof. Although a few example embodiments have been described, those skilled in the art will readily appreciate that many modifications are possible in the exemplary embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory device, comprising:
a first switch configured to receive a first CSL signal and to input or output data;
a second switch configured to receive a second CSL signal;
a sensing and latch circuit coupled between the first and second switches; and
at least one memory cell coupled to the second switch,
wherein the second switch is configured to control timing of read and write operations of the at least one memory cell in response to the second CSL signal, and
wherein an activation time period of the second CSL signal is longer than an activation time period of the first CSL signal.

2. The memory device of claim 1, wherein the second CSL is a write CSL (WCSL) and the second switch is a write switch.

3. The memory device of claim 1, wherein, in a write operation, the sensing and latch circuit is configured to latch.

4. The memory device of claim 1, wherein, in a write operation, the device operates in a voltage mode.

5. The memory device of claim 1, wherein the second CSL is a read CSL (RCSL) and the second switch is a read switch.

6. The memory device of claim 1, wherein, in a read operation, the sensing and latch circuit is configured to operate as a sense amplifier.

7. The memory device of claim 1, wherein, in a read operation, the device operates in a current mode.

8. The memory device of claim 1, wherein the second switch is configured to transmit input and output data from or to the memory cell, respectively.

9. The memory device of claim 1, wherein the memory device is a dynamic random access memory (DRAM), phase change random access memory (PRAM), resistive random access memory (RRAM), or a NAND flash memory.

10. The memory device of claim 1, wherein the memory device is a magneto-resistive random access memory (MRAM).

11. The memory device of claim 10, wherein the MRAM is a STT-MRAM.

12. The memory device of claim 1, wherein the memory cell comprises:
a magnetic tunnel junction (MTJ) element coupled between a bit line and a cell transistor, the cell transistor having a gate coupled to a word line.

13. The memory device of claim 12, wherein the MTJ element comprises:
a pinned layer;
a non-magnetic barrier layer on the pinned layer; and
a free layer on the barrier layer.

14. The memory device of claim 13, wherein the MTJ element has a horizontally magnetized direction.

15. The memory device of claim 12, wherein the MTJ element has a vertically magnetized direction.

16. The memory device of claim 1, wherein, in a write operation, an activated duration of the first switch is shorter than an activated duration of the second switch.

17. The memory device of claim 1, wherein the memory cell comprises:
a cell transistor; and
a dual magnetic tunnel junction (MTJ) element,
wherein the dual MTJ element is connected to a bit line and the cell transistor, and the cell transistor is also connected to a source line and a word line.

18. A memory device, comprising:
a first switch configured to receive a first CSL signal and to input/output data;
a write switch configured to receive a write CSL (WCSL) signal;
a sensing and latch circuit coupled between the first and write switches; and
at least one memory cell coupled to the write switch,
wherein, in a write operation, the sensing and latch circuit is configured to latch and transfer an input data to the memory cell in response to the write CSL signal, and
wherein an activation time period of the write CSL signal is longer than an activation time period of the first CSL signal.

19. The memory device of claim 18, wherein, in a write operation, the device operates in a voltage mode.

20. The memory device of claim 18, wherein the second switch comprises:
at least one write column selection line (WCSL) generator configured to generate the WCSL signal from the first CSL signal; and
a delay circuit configured to also receive the first CSL signal and to output a delayed first CSL signal to disable the WCSL generator.

21. The memory device of claim 18, wherein the first and write switches are activated simultaneously in the write operation.

22. The memory device of claim 18, wherein an activated duration of the first switch is shorter than an activated duration of the write switch.

23. The memory device of claim 18, wherein the memory device is a dynamic random access memory (DRAM), phase change random access memory (PRAM), resistive random access memory (RRAM), or a NAND flash memory.

24. The memory device of claim 18, wherein the memory device is a magneto-resistive random access memory (MRAM).

25. The device of claim 24, wherein the MRAM is a STT-MRAM.

26. The memory device of claim 18, wherein a latch circuit of the sensing and latch circuit comprises a pair of inverters.

27. The memory device of claim 18, wherein the memory cell comprises:
 a magnetic tunnel junction (MTJ) element; and
 a cell transistor.

28. The memory device of claim 18, wherein the memory cell comprises:
 a magnetic tunnel junction (MTJ) element coupled between a bit line and a cell transistor, the cell transistor having a gate coupled to a word line.

29. A memory device, comprising:
 a first switch configured to receive a first CSL signal and to output data;
 a read switch configured to receive a read CSL (RCSL) signal;
 a sensing and latch circuit coupled between the first and read switches;
 a reference generation circuit configured to provide a complementary bit line signal to the sensing and latch circuit; and
 at least one memory cell coupled to the read switch,
 wherein, in a read operation, the sensing and latch circuit is configured as a sense amplifier, and
 wherein an activation time period of the read CSL signal is longer than an activation time period of the first CSL signal.

30. The memory device of claim 29, wherein, in a read operation, the device operates in a current mode.

31. The memory device of claim 29, further comprising:
 a current mirror circuit coupled between the sensing and latch circuit and the read switch.

32. The memory device of claim 31, wherein the current mirror circuit comprises:
 a first transistor having a first size; and
 a second transistor having a second size that is N times the first size, wherein N is an even number, and
 wherein the gates of the first and second transistors are commonly connected and the second transistor is configured to multiply the current of the first transistor by N.

33. The memory device of claim 29, further comprising:
 a word line (WL) enable circuit coupled to the reference generation circuit and the memory cell,
 wherein the WL enable circuit is configured to provide a WL enable signal to the reference generation circuit in response to an active information signal, and
 wherein the reference generation circuit is configured to provide the RSCL signal to the RCSL switch in response the WL enable signal.

34. The memory device of claim 33, wherein the device is configured to generate a pre-charge signal and the CSL signal subsequent to the RSCL signal to perform the read operation in not more than about 5 nanoseconds.

35. The memory device of claim 29, wherein the sensing and latching circuit comprises a cross-coupled sense amplifier including:
 a first PMOS transistor connected between a voltage source and a first NMOS transistor; and
 a second PMOS transistor connected between the voltage source and a second NMOS transistor.

36. The memory device of claim 29, wherein the reference generation circuit comprises:
 a first reference memory cell storing a first value and a first reference switch coupled between the first memory cell and a complementary bit line $BL_{13}$ bar; and
 a second reference memory cell storing a second value and a second reference switch coupled between the second memory cell and the complementary bit line BL_bar,
 wherein the first and second reference switches receive RSCL as an input.

37. The memory device of claim 36, wherein the first value is a "0" and the second value is a "1" and the reference generation circuit is configured to output an average of the current from the first and second memory cells in response to RCSL.

38. The memory device of claim 37, wherein the reference generation circuit comprises:
 a first reference mirror circuit coupled between the first reference switch and the complementary bit line BL_bar; and
 a second reference mirror circuit coupled between the second reference switch and the complementary bit line BL_bar.

39. The memory device of claim 29, wherein the memory device is a dynamic random access memory (DRAM), phase change random access memory (PRAM), resistive random access memory (RRAM), or a NAND flash memory.

40. The memory device of claim 29, wherein the memory device is a magneto-resistive random access memory (MRAM).

41. The memory device of claim 40, wherein the MRAM is a STT-MRAM.

42. A sensing and latching circuit (SLC) of a memory device, comprising:
 a sensing and latch element, configured to;
  couple to a write bit line (BLwrite) in a write operation;
  couple to a read bit line (BLread), separate from BLwrite, and to a
 complementary read bit line (BLread_bar) during a read operation.

43. The SLC of claim 42, wherein the sensing and latch element is responsive to an evaluation signal (EVAL) to compare the currents from BLread and BLread_bar.

44. The SLC of claim 42, further comprising:
 a pre-charge circuit and an equalizer circuit, each coupled to the sensing and latch element, wherein the pre-charge circuit, equalizer circuit, and sensing and latch element are configured to pre-charge BLwrite, BLread and BLread_bar.

45. The SLC of claim 44, wherein:
 the pre-charge circuit comprises first and second PMOS transistors; and
 the equalizer circuit comprises a third PMOS transistor,
 wherein the first, second, and third PMOS transistors have commonly connected gates.

46. The SLC of claim 42, wherein the sensing and latching circuit comprises a cross-coupled sense amplifier including:
 a first PMOS transistor connected between a voltage source and a first NMOS transistor; and
 a second PMOS transistor connected between the voltage source and a second NMOS transistor.

47. The SLC of claim 42, wherein the complementary read bit line BLread_bar is coupled to a reference generation circuit.

48. The SLC of claim 47, wherein the reference generation circuit comprises:
- a first reference memory cell storing a first value and a first reference switch coupled between the first memory cell and the complementary read bit line BLread_bar; and
- a second reference memory cell storing a second value and a second reference switch coupled between the second memory cell and the complementary read bit line BLread_bar, wherein the first and second values are different values.

49. The SLC of claim 42, wherein the memory device is a dynamic random access memory (DRAM), phase change random access memory (PRAM), resistive random access memory (RRAM), or a NAND flash memory.

50. The SLC of claim 42, wherein the memory device is a magneto-resistive random access memory (MRAM).

51. The SLC of claim 50, wherein the MRAM is a STT-MRAM.

\* \* \* \* \*